(12) United States Patent
Nagai et al.

(10) Patent No.: US 8,664,647 B2
(45) Date of Patent: Mar. 4, 2014

(54) ORGANIC ELECTROLUMINESCENT ELEMENT

(75) Inventors: Naomi Nagai, Otsu (JP); Masami Nishida, Otsu (JP); Nobuhito Miura, Otsu (JP); Toshio Matsumoto, Fujisawa (JP); Hirotaka Umezaki, Otsu (JP)

(73) Assignee: Kaneka Corporation, Osaka (JP)

( * ) Notice: Subject to any disclaimer, the term of this patent is extended or adjusted under 35 U.S.C. 154(b) by 69 days.

(21) Appl. No.: 13/386,354

(22) PCT Filed: Jul. 22, 2010

(86) PCT No.: PCT/JP2010/062352
§ 371 (c)(1),
(2), (4) Date: Jan. 20, 2012

(87) PCT Pub. No.: WO2011/010696
PCT Pub. Date: Jan. 27, 2011

(65) Prior Publication Data
US 2012/0119194 A1    May 17, 2012

(30) Foreign Application Priority Data

Jul. 23, 2009  (JP) .................. 2009-172400
Dec. 8, 2009   (JP) .................. 2009-278625

(51) Int. Cl.
*H01L 29/08*       (2006.01)

(52) U.S. Cl.
USPC ............. 257/40; 257/79; 257/103; 257/642; 257/E51.001; 257/E51.026

(58) Field of Classification Search
USPC ....... 257/40, 79, 103, 642, E51.001, E51.026
See application file for complete search history.

(56) References Cited

U.S. PATENT DOCUMENTS 6,107,734 A    8/2000  Tanaka et al.
6,717,358 B1   4/2004  Liao et al.
(Continued)

FOREIGN PATENT DOCUMENTS

JP    11329748       11/1999
JP    2003045676 A    2/2003
(Continued)

OTHER PUBLICATIONS

Kido, T. et al., "Impedance Spectroscopy of ITO/α-NPD/Alg$_3$/LiF/Al Organic Light-Emitting Diodes", Research Institute for Organic Electronics, Yamagata University, Japan, Aug. 30, 2005, 2 pages.
(Continued)

*Primary Examiner* — Andy Huynh
(74) *Attorney, Agent, or Firm* — Alleman Hall McCoy Russell & Tuttle LLP

(57) ABSTRACT

Provided is a high-luminance, long-life laminated organic electroluminescent element. The organic electroluminescent element has a composition in which a plurality of light-emitting units, including at least one organic light-emitting layer, are laminated between a positive electrode and a negative electrode, and in which a linking layer is held between the respective light-emitting units. The linking layer is formed by laminating, in succession from the positive electrode side, an electron generating/transport section, an intermediate layer, and a hole generating/transport section, which contain at least one metal selected from a group consisting of an alkali metal, alkaline earth metal, rare earth metal, alloy of these metals, and compound of these metals. Preferably the intermediate layer contains an electrical insulating non-semiconductive substance having a specific resistance which is between $1.0 \times 10^2$ Ω·cm and $1.0 \times 10^9$ Ω·cm.

7 Claims, 13 Drawing Sheets

(56) References Cited

U.S. PATENT DOCUMENTS

| | | |
|---|---|---|
| 2003/0127967 A1 | 7/2003 | Tsutsui et al. |
| 2003/0189401 A1 | 10/2003 | Kido et al. |
| 2004/0227460 A1 | 11/2004 | Liao et al. |
| 2005/0156197 A1 | 7/2005 | Tsutsui et al. |
| 2006/0008740 A1 | 1/2006 | Kido et al. |
| 2006/0091797 A1 | 5/2006 | Tsutsui et al. |
| 2006/0188745 A1 | 8/2006 | Liao et al. |
| 2006/0220534 A1 | 10/2006 | Shibanuma et al. |
| 2007/0181887 A1 | 8/2007 | Kijima et al. |
| 2007/0182317 A1 | 8/2007 | Kido et al. |
| 2009/0045738 A1 | 2/2009 | Tsutsui et al. |
| 2011/0227119 A1 | 9/2011 | Tsutsui et al. |
| 2011/0227125 A1 | 9/2011 | Tsutsui et al. |

FOREIGN PATENT DOCUMENTS

| | | |
|---|---|---|
| JP | 2003264085 | 9/2003 |
| JP | 2003272860 | 9/2003 |
| JP | 2004281371 | 10/2004 |
| JP | 2006024791 | 1/2006 |
| JP | 2006173550 | 6/2006 |
| JP | 2006351398 | 12/2006 |
| JP | 2008078414 A | 4/2008 |
| JP | 2008532229 A | 8/2008 |

OTHER PUBLICATIONS

ISA European Patent Office, Extended European Search Report of EP10802316, Nov. 28, 2012, Netherlands, 9 pages.

ISA Japan, International Search Report of PCT/JP2010/062352, Oct. 19, 2010, WIPO, 5 pages.

International Bureau of WIPO, Translation of International Preliminary Report on Patentability of PCT/JP2010/02352, Feb. 16, 2012, WIPO, 14 pages.

ORGANIC ELECTROLUMINESCENT ELEMENT

TECHNICAL FIELD

The present invention relates to an organic electroluminescent element having plural organic light-emitting layers. Hereinafter, an organic electroluminescent element may be referred to as an "organic EL element", or merely as an "element".

BACKGROUND ART

Organic EL elements are semiconductor elements that convert electrical energy to optical energy. In recent years, research using organic EL elements have been actively made, and the practical use thereof has been advancing. The organic materials constituting organic EL elements, and other aspects of organic EL elements have been improved, thereby lowering the driving voltage of the elements remarkably and further enhancing the light-emitting efficiency thereof. In the market, televisions wherein an organic EL element is used as a display screen have also been sold.

In order to make the luminance of an EL element higher, a high electric field is applied to the element to make a current density high. However, by making the current density high, the quantity of generated heat increases, causing a problem that deterioration of the organic thin film itself is promoted. In order to solve this problem, it is necessary to raise the luminance of light emitted without changing the driving current.

In contrast, it has been recently reported (see, for example, Patent Documents 1 to 3) that plural light-emitting layers for an organic element are stacked on each other, and the layers are connected to each other in series, thereby making it possible to make the luminance of the element high. Patent Document 4 discloses a stacked-type organic light-emitting element wherein an electrically insulating charge-generating layer containing a metal oxide such as vanadium pentaoxide ($V_2O_5$) is arranged between plural organic light-emitting units. Patent Document 5 suggests the use of a change-generating layer in which molybdenum trioxide is used instead of vanadium pentaoxide.

When an electric field is applied to such an organic light-emitting element wherein a charge-generating layer is arranged between light-emitting units, the charge-generating layer simultaneously generates holes that can be injected into a hole-transporting layer arranged on the cathode side, and electrons that can be injected into an electron-transporting layer arranged on the anode side. For this reason, the plural light-emitting units act like light-emitting units connected to each other in series through the charge-generating layers. Such a stacking method is called multi-photon emission (MPE).

For example, Patent Documents 3 and 4 disclose that a radical anion-containing layer made of Alq:Liq/Al is used as an anode-side layer of such a charge-generating layer. In this structure, Li ions in Liq are reduced by a thermally reducing metal such as Al, and the resultant acts as a radical anion-generating means; thus; an electron-transporting organic substance such as Alq is present in a radical anion state so that electrons which can be injected into the electron-transporting layer are generated.

In the structure where plural light-emitting units are connected to each other, a layer arranged between the light-emitting units is variously named. In the present specification, however, a region that is sandwiched between plural light-emitting units in order to connect the two light-emitting units to each other is called a "connection layer". For the structure of this "connection layer", various forms are suggested besides the structures disclosed in Patent Documents 3 and 4 (see, for example, Patent Documents 5 to 7). When the connection layer has a multi-layered structure, an extra voltage is generated in the connecting region in accordance with the structure of the individual layers or the stack order thereof. Thus, this voltage may cause inconveniences such as that the connection layer becomes unstable, and that reliability for long lifetime cannot be obtained.

For example, when vanadium oxide is arranged on the anode side of a charge-generating layer, stoichiometry of the material thereof is important. If its composition ratio departs therefrom, the charge-generating layer becomes unstable. The unstable charge-generating layer reduces the function thereof remarkably. In order to enable a connection layer to act stably as a charge-generating layer, it is known that an interfacial structure on the anode-side of the connection layer is very important.

In the meantime, Patent Document 7 discloses that a layer made of an oxide of an alkali metal or alkaline earth metal is arranged on the anode side of a connection layer. In this oxide layer, metal ions of the oxide act as an electron-donating dopant, so that this layer has an effect of improving the efficiency of injecting electrons to the light-emitting unit present on the anode side of the connection layer. However, when a metal oxide such as lithium carbonate ($Li_2CO_3$) is produced, metal ions easily diffuse to the organic layer. As a result, it is feared that the lifetime of the element is made short.

PRIOR ART DOCUMENTS

Patent Documents

Patent Document 1: JP-B-11-329748
Patent Document 2: JP-B-2003-45676
Patent Document 3: JP-B-2003-264085
Patent Document 4: JP-A-2003-272860
Patent Document 5: JP-A-2006-24791
Patent Document 6: JP-A-2008-532229
Patent Document 7: JP-A-2006-351398

DISCLOSURE OF THE INVENTION

Problems to be Solved by the Invention

In light of the above-mentioned matter, an object of the invention is to provide an organic EL element including plural light-emitting units laminated over each other wherein the structure of a connection layer or connection layers arranged between the units is improved to give an excellent reliability.

Means for Solving the Problems

In order to solve the problems, the inventors have made eager investigations, and they have found out that, according to a structure described below, an organic EL element structure excellent in reliability can be provided. Thus, the invention has been completed.

The invention relates to an organic electroluminescent element wherein plural light-emitting units 3 each comprising at least one organic light-emitting layer are stacked between an anode 2 and a cathode 5, and a connection layer 4 is sandwiched between the respective light-emitting units. In the connection layer 4-1, the following are successively stacked from the anode 2 side: an electron-generating and transporting section 4-1-*a*; an intermediate layer 4-1-*b*; and a hole-generating and transporting section 4-1-*c*.

The electron-generating and transporting section 4-1-*a* comprises at least one selected from the group consisting of alkali metals, alkaline earth metals, rare earth metals, and alloys and compounds of these metals. Among these, in the electron-generating and transporting section, lithium compounds are preferably used, and LiF is most preferably used. The hole-generating and transporting section 4-1-*c* preferably comprises an azatriphenylene derivative, or a metal oxide having a hole-injecting ability. The metal oxide having a hole-injecting ability may be molybdenum oxide, ruthenium oxide, manganese oxide, tungsten oxide, vanadium oxide or some other, and is preferably molybdenum trioxide.

In a first embodiment of the invention, the intermediate layer 4-1-*b* is a layer comprising a non-semiconductor substance which is electrically insulating. The electrically insulating non-semiconductor substance preferably has a resistivity of $1.0 \times 10^2$ to $1.0 \times 10^9$ $\Omega \cdot cm$. The electrically insulating non-semiconductor substance preferably has a dielectric constant of 2 to 4.5 inclusive.

In a second embodiment of the invention, the intermediate layer 4-1-*b* is a layer comprising a charge-transporting organic material. Examples of the charge-transporting organic material include electron-transporting materials, hole-transporting materials, and ambipolar-transporting materials.

Furthermore, the invention relates to a display device and a lighting apparatus each comprising the above-mentioned organic electroluminescent element.

Effects of the Invention

Since the organic EL element of the invention has the intermediate layer 4-1-*b* between the electron-generating and transporting section 4-1-*a* and the hole-generating and transporting section 4-1-*c* of the connection layer 4-1, interaction between the electron-generating and transporting section and the hole-generating and transporting section is restrained. For this reason, even in the case of using, for the electron-generating and transporting section 4-1-*a*, lithium fluoride or any other substance exhibiting a strong interaction with a hole-generating and transporting material, the connection layer 4 functions as a charge-generating layer. According to this structure, the luminance of the element can be restrained from being deteriorated, and further the extension of the lifetime and an improvement in the reliability can be realized.

BRIEF DESCRIPTION OF THE DRAWINGS

FIG. 5A, FIG. 5B and FIG. 5C show a voltage-to-current density, a light-emitting efficiency, and a current efficiency thereof, respectively.

FIG. 6A, FIG. 6B, and FIG. 6C show a voltage-to-current density, a light-emitting efficiency, and a current efficiency, respectively.

FIG. 10A, FIG. 10B and FIG. 10C show a voltage-to-current density, a light-emitting efficiency, and a current efficiency, respectively.

FIG. 11A and FIG. 11B show a voltage-to-current density and a light-emitting efficiency, respectively.

FIG. 16A and FIG. 16B show a voltage-to-current density, and a light-emitting efficiency, respectively.

FIG. 17A and FIG. 17B show a voltage-to-current density, and a light-emitting efficiency, respectively.

EMBODIMENTS FOR CARRYING OUT THE INVENTION

Figure 1:
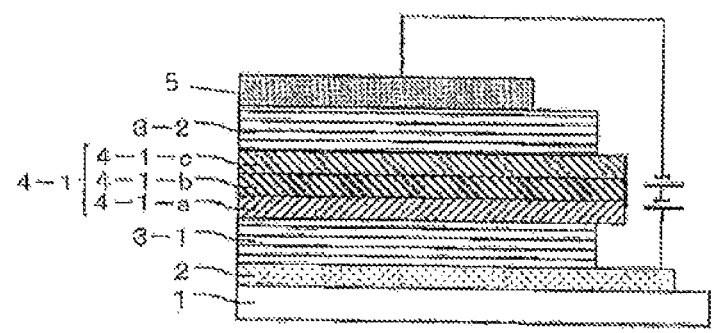
FIG. 1 is a schematic view illustrating a structure of an organic EL element of an embodiment of the invention.

Hereinafter, embodiments according to the invention will be described in detail with reference to the drawings. FIG. 1 schematically illustrates a cross section structure of an organic EL element according to an embodiment of the invention. The element illustrated in this figure has a substrate 1, an anode 2, plural light-emitting units 3-1 and 3-2 that are successively stacked over the anode 2, a connection layer 4-1 provided between the light-emitting units, and a cathode 5 stacked on the light-emitting unit 3-2. In FIG. 1, a structure having two light-emitting units is illustrated; however, the element of the invention may have a structure having three or more light-emitting units. In the structure having three or more light-emitting units, it is preferred to provide a connection layer between any adjacent two of the light-emitting units.

The substrate 1 provided in the organic EL element is not particularly limited, and may be a known substrate. The substrate 1 may be appropriately selected from, for example, transparent substrates such as a glass piece; a silicon substrate; and flexible film substrates. In the case of a bottom emission type organic EL element in which light is taken out from the substrate side, the transmittance of the substrate 1 is preferably 80% or more in the range of visible rays, more preferably 95% or more from the view point of reducing a loss of emitted light.

The anode 2 provided on the substrate 1 is not particularly limited either, and may be a known anode. Examples thereof include indium tin oxide (ITO), indium zinc oxide (IZO), $SnO_2$, and ZnO. Of these examples, ITO or IZO, which are high in transparency, is preferred from the viewpoint of the efficiency of taking out light generated from the light-emitting layer, and ease of patterning. The anode may be optionally doped with one or more dopants such as aluminum, gallium, silicon, boron, niobium and the like.

From the viewpoint of transparency, the transmittance of the anode 2 is preferably 70% or more, more preferably 80% or more, in particular preferably 90% or more in the range of visible rays. The method for forming the anode 2 on the substrate 1 is not particularly limited, and may be, for example, sputtering or thermal CVD.

The following describes the light-emitting units 3. Each of the light-emitting units 3 corresponds to constituting-elements of the remainder obtained by excluding both an anode and a cathode from constituting-elements of a conventional organic EL element having a single light-emitting unit. Each of the light-emitting units has at least one light-emitting layer substantially made of an organic compound. Each of the light-emitting units 3 may have any stacked structure as far as the unit has at least one light-emitting layer. The unit may have, for example, a structure having a hole-injecting layer or a hole-transporting layer, or some other on the anode side of the light-emitting layer, and further having an electron-transporting layer or an electron-injecting layer or some other on the cathode side of the light-emitting layer.

The method for forming individual layers that constitute each of the light-emitting units 3 is not particularly limited. A part of the organic layers may be formed by, for example, a spin coating method besides vacuum deposition. Materials used in the hole-injecting layer, the hole-transporting layer, the light-emitting layer, the electron-transporting layer, the electron-injecting layer, and other layers are not particularly limited either, and may each be any appropriate known substance. Furthermore, organic materials used in the light-emitting layer are not particularly limited either, and may be any known substance.

It is preferred that each of the light-emitting units has a hole-transporting layer on the anode side thereof. It is particularly preferred that the light-emitting unit 3-2 arranged on the cathode side of the connection layer 4-1, which will be described later, has a hole-transporting layer containing an arylamine compound. In this case, the arylamine compound is easily converted into a radical cation, thereby raising the efficiency of transporting holes from a hole-generating and transporting section 4-1-c to the light-emitting layer of the light-emitting unit 3-2.

Examples of the arylamine compound used in the hole-transporting layer include N,N,N',N'-tetraphenyl-4,4'-diaminophenyl, N,N'-diphenyl-N,N'-di(3-methylphenyl)-4,4'-diaminobiphenyl, 2,2-bis(4-di-p-tolylaminophenyl)propane, N,N,N',N'-tetra-p-tolyl-4,4'-diaminobiphenyl, bis(4-di-p-tolylaminophenyl)phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, 4-N,N'-diphenylamino-(2-)benzene, 3-methoxy-4'-N,N-diphenylaminostilbene, N-phenylcarbazole, 1,1-bis(4-di-p-triaminophenyl)-cyclohexane, 1,1-bis(4-di-p-triphenyl)cyclohexane, 1,1-bis(4-di-p-triaminophenyl)-4-phenylcyclohexane, bis(4-dimethylamino-2-methylphenyl)-phenylmethane, N,N,N—N-tri(p-tolyl)amine, 4-(di-p-tolylamino)-4'-[4(di-p-triamino)styryl]stilbene, N,N,N',N'-tetraphenyl-4,4'-diamino-biphenyl-N-phenylcarbazole, 4,4'-bis[N-(1-naphthyl)-N-phenylamino]biphenyl, 4,4'-bis[N-(1-naphthyl)-N-phenylamino]p-terphenyl, 4,4'-bis[N-(3-acenaphthenyl)-N-phenyl-amino]biphenyl, 1,5-bis[N-(1-naphthyl)-N-phenyl-amino]naphthalene, 4,4'-bis[N-(9-anthryl)-N-phenyl-amino]biphenyl, 4,4'-bis[N-(1-anthryl)-N-phenyl-amino]p-terphenyl, 4,4'-bis[N-(2-phenanthryl)-N-phenyl-amino]biphenyl, 4,4'-bis[N-(8-fluoranthenyl)-N-phenyl-amino]biphenyl, 4,4'-bis[N-(2-pyrenyl)-N-phenylamino]biphenyl, 4,4'-bis[N-(2-perylenyl)-N-phenyl-amino]biphenyl, 4,4'-bis[N-(1-coronenyl)-N-phenyl-amino]biphenyl, 2,6-bis[di-(1-naphthyl)amino]naphthalene, 2,6-bis[N-(1-naphthyl)-N-(2-naphthyl)amino]naphthalene, 4,4'-bis[N,N-di(2-naphthyl)amino]terphenyl, 4,4'-bis{N-phenyl-N-[4-(1-naphthyl)phenyl]amino}biphenyl, 4,4'-bis[N-phenyl-N-(2-pyrenyl)-amino]biphenyl, 2,6-bis[N,N-di(2-naphthyl)amino]fluorene, 4,4'-bis[N-phenyl-N-(2-pyrenyl)-amino]biphenyl, 2,6-bis[N,N-di-p-triamino]terphenyl, bis(N-1-naphthyl)(N-2-naphthyl)amine, and 4,4'-bis[N-(2-naphthyl)-N-phenyl-amino]biphenyl. Additionally, known substances used in organic EL elements may be used.

It is preferred that the hole-transporting layer contains, as the arylamine compound, a triarylamine derivative. It is particularly preferred that the layer contains 4,4'-bis[N-(2-naphthyl)-N-phenyl-amino]biphenyl (also referred to as "α-NPD" or "NPB"), which is represented by the following chemical formula:

[Formula 1]

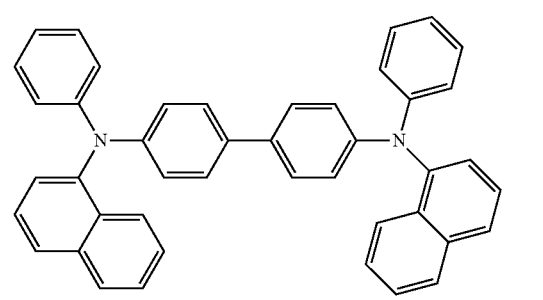

The following describes the cathode 5. Materials used in the cathode 5 are preferably a metal having a low work function, any alloy thereof, any metal oxide thereof, or some other. Examples of the metal having a low work function include Li as an alkali metal, and Mg and Ca as alkaline earth metals. A metallic simple substance made of a rare earth metal or some other; an alloy of these metals and Al, In, Ag or some other; or the like may also be used. As disclosed in JP-A-2001-102175 and others, an organic metal complex compound containing at least one selected from the group consisting of alkaline earth metal ions and alkali metal ions may be used for an organic layer contacting the cathode. In this case, it is preferred to use, for the cathode, a metal capable of reducing the metal ion of the complex compound into a metal in a vacuum, for example, Al, Zr, Ti or Si, or an alloy containing these metals.

The following describes the structure of the connection layer 4, which is a feature of the invention. Each connection layer 4 is sandwiched between two light-emitting units. For example, in FIG. 1, the connection layer 4-1 is sandwiched between the light-emitting units 3-1 and 3-2. In a specific embodiment, the connection layer 4 has a structure wherein from the anode 2 side, an electron-generating and transporting section 4-1-*a*, an intermediate layer 4-1-*b*, and a hole-generating and transporting section 4-1-*c* are successively stacked. In the first embodiment of the invention, the intermediate layer 4-1-*b* is a layer containing a non-semiconductor substance which is electrically insulating. In the second embodiment of the invention, the intermediate layer 4-1-*b* is a layer containing a charge-transporting organic material.

First, a description is made about an embodiment of the connection layer in the first embodiment. In the electron-generating and transporting section 4-1-*a*, the process by which electron-transporting molecules make a transition from electrically neutral molecules into a radical anion state is repeatedly performed, thereby generating electrons and transporting the electrons to the first light-emitting unit 3-1 adjacent to the anode 2 side. The electron-generating and transporting section 4-1-*a* preferably contains an electron-donating metal such as an alkali metal, an alkaline earth metal or a rare earth metal, or a compound of these metals (these may be correctively referred to as an "alkali metal or the like" hereinafter). Preferably, the alkali metal is Li or some other, the alkaline earth metal is Mg, Ca or some other, and the rare earth metal is Eu, Ce or some other. An alloy of such a metal and Al, Ag, In or some other is also preferably used. Of these examples, alkali metals are preferred, and Li is particularly preferred.

The alkali metal or the like may be present in the form of an inorganic metal compound (provided that any metal oxide is excluded) such as lithium fluoride (LiF), or an organic metal compound such as (8-quinolinolato) lithium complex (Liq). Among these, lithium fluoride is suitable for extending the lifetime of the organic EL element since lithium fluoride does not easily diffuse into the light-emitting unit 3-1.

LiF is excellent in efficiency of injecting electrons from the cathode to the light-emitting unit, and is effective for lowering the driving voltage of the organic EL element. Thus, in conventional organic EL elements, LiF is widely used for a buffer layer for their cathode. However, reports have hardly been made about examples where LiF is used for connection layers of an MPE type element in which plural light-emitting units are stacked. It is assumed that this matter is caused by a difference in structure between the cathode and the connection layers.

That is, when LiF is used for the electron-generating and transporting section arranged on the anode side of the connection layer, LiF is arranged adjacently to or in the vicinity of the hole-generating and transporting section arranged on the cathode side of the connection layer to act as a charge-generating layer. However, an interaction is strong between the electron-generating and transporting section 4-1-*a* using LiF and the hole-generating and transporting section 4-1-*c*; thus, electrons generated in the electron-generating and transporting section 4-1-*a* and holes generated in the hole-generating and transporting section 4-1-*c* are not transported into the light-emitting unit 3-1 or the light-emitting unit 3-2 so that the electrons and the holes easily remain the connection layer 4-1. By the effect of such an interaction, an electric current does not easily flow in the element. Therefore, in order to gain a desired luminance, it is necessary to cause an excessive electric current to flow in the element. As a result, the lifetime of the element tends to become short. It is considered that in order to avoid such a problem, LiF, which is strong in interaction with the hole-generating and transporting section, has not been hitherto used for an electron-generating and transporting section of the connection layer.

For example, Patent Document 7 (JP-A-2006-351398) described above discloses a connection layer having a charge-transporting material layer including Alq$_3$ or some other between a layer containing an oxide such as Li$_2$CO$_3$ as an electron-injecting layer and an azatriphenylene derivative as a hole-generating layer. It is mentioned that according to this structure, deterioration based on interaction between the electron-injecting layer and the hole-generating layer is restrained. On the other hand, JP-A-2006-351398 states that when LiF is used for the electron-injecting layer, increase in voltage and deterioration in luminance are observed.

In contrast, in the first embodiment of the invention, a layer containing an electrically insulating non-semiconductor substance is arranged, as an intermediate layer 4-1-*b* between the electron-generating and transporting section 4-1-*a* and the hole-generating and transporting section 4-1-*c*, which will be described later. For this reason, even when LiF is used for the electron-generating and transporting section 4-1-*a*, the interaction thereof with the hole-generating and transporting section 4-1-*c* is restrained so that the high electron-injecting efficiency that LiF has is maintained. Thus, the driving voltage can be made low, and lifetime can be extended.

The inventors have actually produced MPE type elements each having a connection layer having a stacked structure of Li$_2$CO$_3$/Alq$_3$/an azatriphenylene derivative, as disclosed in JP-A-2006-351398, and then evaluated the element. As a result, the inventors have found out that between elements having the same structure among these elements, characteristics are varied. It is assumed that this matter is caused by an instable connection between the oxide such as Li$_2$CO$_3$, and the azatriphenylene derivative. In contrast, in the first embodiment of the invention, wherein the intermediate layer 4-1-*b* contains the electrically insulating non-semiconductor substance, a variation in characteristics is small between the elements having the same structure. Thus, a stable connecting state can be generated between the electron-generating and transporting section 4-1-*a* and the hole-generating and transporting section 4-1-*c*.

The electron-generating and transporting section 4-1-*a* may be, besides the layer of a simple substance of an alkali metal or the like, for example, a mixed layer of an alkali metal or the like and an organic compound such as an electron-transporting material. Such a mixed layer may be formed by, for example, vapor co-deposition. In the mixed layer, the ratio by volume of the organic compound to the alkali metal or the like is preferably from 0.1 to 10. The organic compound that is combined with the alkali metal or the like to form the mixed layer is preferably tris(8-hydroxyquinolinato) aluminum (III) (Alq$_3$), which is an electron-transporting material.

The electron-generating and transporting section 4-1-*a* preferably has, on the cathode side thereof, a layer made of a thermally reducing metal capable of reducing an alkali metal ion, an alkaline earth metal ion or a rare earth metal ion of the electron-generating and transporting section to a metal in a vacuum, an example of the thermally reducing metal being Al, Zr, Ti or Si, or an alloy containing these metals. As described in JP-A-2000-182774, the thermally reducing metal makes it possible to reduce and isolate a metal in a metal compound by reducing reaction in a vacuum, and acts as a "reducing reaction generating layer" for the electron-generating and transporting section. The element has the reducing reaction generating layer, thereby reducing the metal ion in the electron-generating and transporting section effectively. Thus, a barrier against injection of electrons from the electron-generating and transporting section 4-1-*a* to the anode-side light-emitting unit 3-1 becomes small so that the driving voltage of the element can be lowered. The reducing reaction generating layer also has an effect of restraining the diffusion of the metal ion in the electron-generating and transporting section 4-1-*a*. The thermally reducing metal for forming the reducing reaction generating layer is in particular preferably Al, and the film thickness thereof is preferably 5 nm or less, more preferably 2 nm or less.

The following describes the layer 4-1-*b*, which contains an electrically insulating non-semiconductor substance, in the connection layer 4. The non-semiconductor substance used in the layer 4-1-*b* is not particularly limited as far as the substance has an electrically insulating property and exhibits no property of a semiconductor. The resistivity thereof is preferably $1.0 \times 10^2 \Omega \cdot cm$ or more, more preferably $1.0 \times 10^5 \Omega \cdot cm$ or more. The dielectric constant of the non-semiconductor substance is preferably 4.5 or less, more preferably 4 or less. If the resistivity is too low or the dielectric constant is too high, the effect of restraining the interaction between the electron-generating and transporting section and the hole-generating and transporting section is not sufficiently obtained; thus, the element tends to be easily deteriorated by the remaining charges in the connection layer or by an increase in driving voltage that is associated with the remaining charges.

The intermediate 4-1-*b* contains the non-semiconductor substance, which has an electric insulating property (resistivity) and a dielectric constant as described above, thereby restraining the interaction between the electron-generating and transporting section 4-1-*a* and the hole-generating and transporting section 4-1-*c*. This matter contributes to a fall in the driving voltage or an extension of the lifetime of the element. Moreover, the intermediate layer 4-1-*b* is electrically insulating, so that an advantage can be obtained that the anode made of ITO or some other and the intermediate layer can easily be electrically insulated to each other by a mask vapor deposition or some other method.

By contrast, if the resistivity of the non-semiconductor substance is too high, charges tend to remain easily in the connection layer. From this viewpoint, the resistivity of the non-semiconductor substance is preferably $1.0 \times 10^9 \Omega \cdot cm$ or less, more preferably $1.0 \times 10^8 \Omega \cdot cm$ or less. If the dielectric constant of the non-semiconductor substance is too low, an amorphous film tends not to be easily formed by vacuum deposition. From this viewpoint, the dielectric constant of the non-semiconductor substance is preferably 2 or more, more preferably 2.5 or more.

The resistivity and the dielectric constant can each be calculated out from a current response to application of a voltage. The dielectric constant may be measured by analyzing a measurement cell in which a target sample having a predetermined thickness is sandwiched between an ITO electrode layer (150 nm) and an Al electrode layer (100 nm) through impedance spectrometry using an electrochemical analysis apparatus (for example, model 660B, manufactured by BAS Inc.). First, in an AC-impedance mode, an equivalent circuit of the cell is presumed from a trace of the impedance Z on a complex plane. Next, in an impedance-potential mode, an electrostatic capacity is calculated from the equivalent circuit that is presumed to be a potential waveform of the impedance-potential. The dielectric constant is then decided. The dielectric constant may depend on a film thickness; in this case, however, it is advisable to adopt, as the dielectric constant of the substance, a value of the substance that is of 100 nm thickness.

The intermediate layer 4-1-*b* is preferably formed by vacuum deposition since this method makes it possible to control the film thickness easily. The non-semiconductor substance used in the intermediate layer is preferably a compound that can be formed into a film by vacuum deposition. Preferred examples of the compound include organic metal complexes such as bis(2,2,6,6-tetramethyl-3,5-heptanedionato)calcium (another name: bis(dipivaloylmethanato)calcium, which may be abbreviated to $Ca(DPM)_2$), bis(2,4-pentanedionato)magnesium (another name: bis(acetylacetonate) magnesium, which may be abbreviated to $Mg(acac)_2$), bis(2,2,6,6-tetramethyl-3,5-heptanedionato)magnesium (another name: bis(dipivaloylmethanato)magnesium, which may be abbreviated to $Mg(DPM)_2$), 2,2,6,6-tetramethyl-3,5-heptanedionatolithium (another name: dipivaloylmethanato lithium, which may be abbreviated to Li(DPM)), tris(2,2,6,6-tetramethyl-3,5-heptanedionato)aluminum (another name: tris(dipivaloylmethanato)aluminum, which may be abbreviated to $Al(DPM)_3$).

The non-semiconductor substance used in the non-semiconductor substance containing layer 4-1-*b* in the connection layer 4 should be preferably excellent in optical transparency and be excellent in transmissivity in the range of visible rays. When the non-semiconductor substance containing layer 4-1-*b* is a single layer made of an electrically insulating non-semiconductor substance, the film thickness thereof is preferably from 2 to 10 nm. When the thickness of the non-semiconductor substance containing layer is too thin, the interaction between the electron-generating and transporting section 4-1-*a* and the hole-generating and transporting section 4-1-*c* is not effectively restrained so that the driving voltage of the element may rise. Conversely, if the thickness of the non-semiconductor substance containing layer is too thick, a tunnel probability between the electron-generating and transporting section 4-1-*a* and the hole-generating and transporting section 4-1-*c* falls largely so that no charges are shifted. Thus, the connection layer 4 tends not to act as a charge-generating layer. From this viewpoint, when the layer 4-1-*b* is a single layer made of an electrically insulating non-semiconductor substance, the film thickness thereof is preferably 8 nm or less, more preferably 3 nm or less.

The intermediate layer 4-1-*b* may be, besides a single layer of an electrically insulating non-semiconductor substance, for example, a mixed layer with an electrically insulating non-semiconductor substance and a hole-generating and transporting material. In order to make the driving voltage of the MPE type element low, the content of the electrically insulating non-semiconductor substance in this mixed layer is preferably 10% or more by weight, more preferably 25% or more by weight. The hole-generating and transporting material in the mixed layer is preferably an azatriphenylene derivative used in the hole-generating and transporting section 4-1-*c*, which will be described later, or a metal oxide having a hole-injecting ability.

When the intermediate layer 4-1-*b* is rendered as a mixed layer, the degree of freedom for optical adjustment of the MPE type element can be improved. In the MPE type element, in order to optimize the efficiency of taking out light from each of the light-emitting unit layers, it is preferred to adjust an optical path length. For example, in the element in FIG. 1, in the case of taking out light from the substrate 1 side, it is preferred to optimize not only the optical path length from the light-emitting layer of the first light-emitting unit 3-1 to a light-taking-out point but also that from the light-emitting layer of the second light-emitting unit 3-2 to a light-taking-out point. When the optical path length from the light-emitting layer of the first light-emitting unit 3-1 is optimized by adjusting the thickness of the anode 2 or by some other way, the film thickness of the intermediate layer 4-1-*b* may be required to be adjusted in order to also optimize the optical path length from the light-emitting layer of the second light-emitting unit 3-2. However, when the intermediate layer 4-1-*b* is a single layer of an electrically insulating non-semiconductor substance, an adjustable range of the film thickness may be restricted as described above; thus, the optical path length is not optimized so that the efficiency of taking out light from the second light-emitting unit layer may be required to be sacrificed. In contrast, when the intermediate layer 4-1-*b* is rendered a mixed layer with the substance and a hole-generating and transporting material, the tunnel probability becomes higher than compared to a single layer of an electrically insulating non-semiconductor substance even when these layers have the same thickness. Thus, even when the thickness of the intermediate layer is, for example, more than 10 nm, the connection layer 4 can keep the function as a charge-generating layer; therefore, the optical path length can be adjusted to optimize the efficiency of taking out light from the second light-emitting unit. When the intermediate layer 4-1-*b* is the mixed layer, the thickness thereof is not particularly limited. A value obtained by multiplying the content (percentage by weight) of the electrically insulating non-semiconductor substance by the thickness is preferably from 2 to 10 nm, more preferably from 2 to 8 nm, even more preferably from 2 to 3 nm.

When the intermediate layer 4-1-*b* is the mixed layer and a metal oxide having a hole-injecting ability is used for the hole-generating and transporting section 4-1-*c*, which will be described below, the intermediate layer 4-1-*b* is preferably a mixed layer of an electrically insulating non-semiconductor substance and molybdenum trioxide. In this case, it is preferred that the content of the electrically insulating non-semiconductor substance is 10% or more by weight and the content of molybdenum trioxide is 10% or more by weight.

The following describes the hole-generating and transporting section 4-1-*c* in the connection layer 4. The hole-generating and transporting section may be any section having a function of generating holes and transporting the holes. In an embodiment, the hole-generating and transporting section preferably contains an azatriphenylene derivative represented by the following general formula:

[Formula 2]

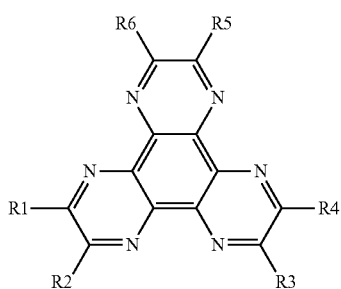

wherein R1 to R6 are each independently selected from a group consisting of hydrogen, nitrile, nitro, sulfonyl, sulfoxides, trifluoromethyl, esters, amides, substituted or unsubstituted aryls, substituted or unsubstituted heteroaryls, and substituted or unsubstituted alkyls; and any adjacent Rn's wherein n represents 1 to 6 may be bonded to each other through a cyclic structure.

The azatriphenylene derivative which has an electron-withdrawing property is stacked on or mixed with a material having a hole-transporting property in order to be brought into contact with each other, whereby this charged material which has a hole-transporting property is easily converted into a radical cation form. For this reason, when the light-emitting unit 3-2 adjacent to the hole-generating and transporting section 4-1-*c* contains, for the hole-transporting layer, a material having an electron-donating property like the above-mentioned arylamine compound, the electron-donating compound which constitutes the hole-transporting layer is easily converted into a radical cation form so that the performance of transporting holes from the connection layer 4 to the light-emitting unit 3-2 is improved.

In another embodiment, the hole-generating and transporting section 4-1-*c* preferably contains a metal oxide having a hole-injecting ability. In this case, the hole-generating and transporting section 4-1-*c* may be a single layer made of the metal oxide having a hole-injecting ability, or may be a mixed layer of the oxide and a hole-transporting material such as an arylamine compound.

Examples of the metal oxide having a hole-injecting ability include vanadium oxide ($V_2O_5$ or $VO_5$), ruthenium oxide ($RuO_4$ or $RuO_2$), manganese oxide (MnO or $MnO_2$), or molybdenum oxide ($MoO_2$ or $MoO_3$). As described in JP-A-2006-24791, a metal oxide such as molybdenum trioxide is stacked over or mixed with a charged material having a hole-transporting property to be brought into contact each other, thereby forming a charge transfer complex, so that the charged material having a hole-transporting property is converted into a radical cation form. Herein, the charge transfer complex is any compound having a charge transfer interaction among intermolecular compounds each formed of molecules of two or more kinds. From molybdenum trioxide, which is an electron-donating molecule, charges are partially transferred to an electron-accepting molecule that is the hole-transporting material, so that the charged molecules form a complex by an attractive force such as orbital interaction, electrostatic interaction or some other. Thus, when the second light-emitting unit 3-2 adjacent to the hole-generating and transporting section 4-1-*c* contains, for the hole-transporting layer, an electron-donating material like the above-mentioned arylamine compound, the electron-donating compound which constitutes the hole-transporting layer is easily converted into a radical cation form. As a result, the performance of transporting holes from the connection layer 4 to the second light-emitting unit 3-2 is improved.

In the connection layer 4, the hole-generating and transporting section 4-1-*c* may function also as a hole-injecting layer constituting a partial region of the second light-emitting unit 3-2 adjacent to the cathode side of the connection layer 4. In this case, it is not necessarily essential to provide a hole-injecting layer into the light-emitting unit 3-2.

The connection layer 4-1 described above acts as a charge-generating layer which fulfills a function of injecting holes toward a cathode direction and injecting electrons toward an anode direction. In the first embodiment of the invention, the intermediate layer 4-1-*b* of the connection layer has the electrically insulating non-semiconductor substance; therefore, even when a non-oxide such as LiF is used for the electron-generating and transporting section 4-1-*a*, the element is restrained from being deteriorated by the interaction with the hole-generating and transporting section 4-1-*c*. Thus, the lifetime of the element is improved. Additionally, LiF has lower levels of diffusion to any organic layer than metal oxides such as $Li_2CO_3$, and is further excellent in electron-injecting efficiency, so that LiF is effective for lowering the driving voltage of the organic EL element.

The following describes the second embodiment of the invention wherein a layer containing a charge-transporting organic material is used as the intermediate layer 4-1-*b*. The second embodiment is similar to the first embodiment except that the layer which contains a charge-transporting organic material is used instead of the layer containing the electrically insulating non-semiconductor substance in the first embodiment. The "charge-transporting organic material" means an organic compound in which electrons or holes having charges for electric resistance or thermal electromotive force can be shifted in a substance.

In the second embodiment, the layer 4-1-*b* containing the charge-transporting organic material may be a single layer of a charge-transporting organic material, or a mixed layer of a charge-transporting organic material and a hole-generating and transporting material. Examples of the mixed layer include, more specifically, a mixed layer of a charge-transporting organic material and an azatriphenylene derivative, or a mixed layer of a charge-transporting organic material and a metal oxide having a hole-injecting ability.

In order to restrain a rise in the voltage of the element, the content of the charge-transporting organic material in this mixed layer is preferably 20% or more by weight, more preferably 30% or more by weight.

Examples of an electron-transporting material which is an example of the charge-transporting organic material include Bathocuproin (BCP), and tris(8-hydroxyquinolinato)aluminum (III) ($Alq_3$). Of these examples, $Alq_3$ is preferably used from the viewpoint of versatility. Examples of a hole-transporting material which is an example of the charge-transporting organic material include arylamine compounds. Of these examples, α-NPD is preferably used from the viewpoint of a high versatility. It is allowable to use a compound having an ambipolar transporting property such as 4,4'-bis(N-carbazolyl)biphenyl (CBP) which is represented by the following chemical formula:

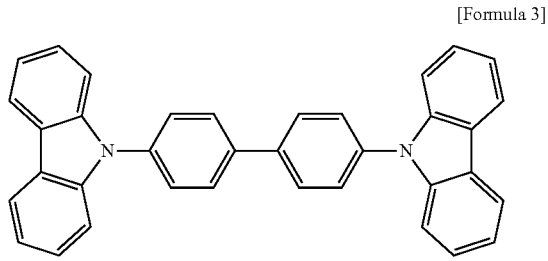 [SMILES: c1ccc2c(c1)c1ccccc1n2-c1ccc(-c2ccc(-n3c4ccccc4c4ccccc43)cc2)cc1]

[Formula 3]

The film thickness of the "layer containing a charge-transporting organic material" is preferably from 20 to 100 nm inclusive, more preferably from 50 to 100 nm inclusive in order to restrain a rise in the voltage of the element.

As described above, according to the invention, in an organic EL element wherein plural light-emitting units are stacked, a connection layer or connection layers (each) having an intermediate layer 4-1-*b* is/are used between the light-emitting units, thereby restraining interaction between the electron-generating and transporting section 4-1-*a* and the hole-generating and transporting section 4-1-*c*, so that the element having a low level in initial-luminance deterioration and a long lifetime can be obtained. In the case of using, in particular, lithium fluoride for the electron-generating and transporting section 4-1-*a*, it is possible to attain a drop in driving voltage as well as the long lifetime.

When the organic EL element of the invention is made into a structure wherein respective light-emitting units 3 have different luminous colors, desired mixed color emission can be obtained. When respective pixels are divided into three primary colors of R, G and B, for example, in a manner of using a shadow mask or some other manner, a color display element can be produced. The organic EL element is a spontaneously light-emitting device; thus, the element does not require any backlight or the like so that the element can be made super-thin for the use of a display. Additionally, the element is also low in consumption power, so that the element can be effectively applied to a lighting apparatus as well as a display device from the viewpoint of energy saving.

EXAMPLES

Next, a description is made about processes for producing organic EL elements of specific Examples of the invention and Comparative Examples against these Examples, and evaluation results thereof.

Reference Examples 1 to 4

In order to check operation of respective connection layers of the invention, the structure of the connection layer of the invention and the structure of a connection layer of each of the Comparative Examples were each arranged on the cathode side of an organic-EL-element having a single light-emitting unit. A current-voltage measurement was then conducted. In each of Reference Examples 1 to 4, described below, a bottom-type evaluation substrate was produced that had a light-emitting region 2 mm×2 mm in size formed on a glass substrate on which a patterned ITO film (thickness: 150 nm) was formed as an anode.

Reference Example 1

The following was formed into a film of 10 nm thickness as a hole-injecting layer on the ITO anode by vacuum deposition (deposition rate: 0.5 to 0.8 nm/sec): a hole-injecting compound made of a triphenylene derivative represented by the following chemical formula (hereinafter abbreviated to HAT ($CN)_6$):

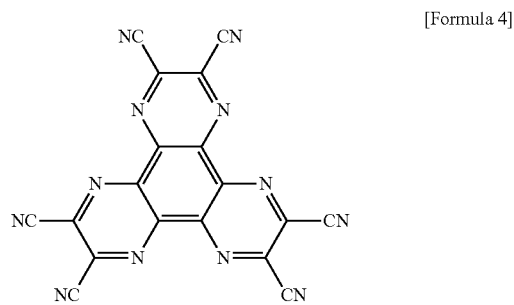 [SMILES: N#Cc1nc2c3nc(C#N)c(C#N)nc3c3nc(C#N)c(C#N)nc3c2nc1C#N]

[Formula 4]

Next, the following was formed into a film of 50 nm thickness as a hole-transporting layer by vacuum deposition (deposition rate: 0.8 to 1.2 nm/sec): 4,4'-bis[N-(2-naphthyl)-N-phenyl-amino]biphenyl (hereinafter abbreviated to α-NPD) represented by the following chemical formula:

[Formula 5]

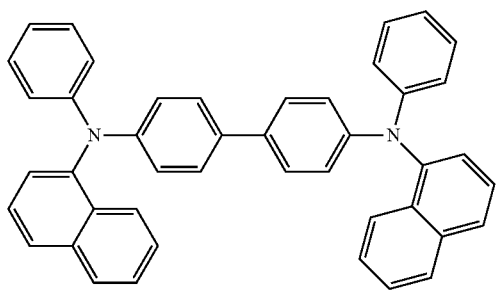

Next, the following was formed into a film of 60 nm thickness as a light-emitting layer by vacuum deposition (deposition rate: 2.9 to 3.1 nm/sec): [tris(8-hydroxyqunolinato)]aluminum (III) (hereinafter abbreviated to Alq$_3$) represented by the following chemical formula:

[Formula 6]

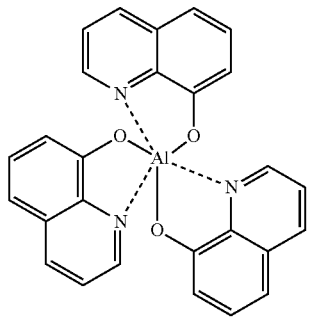

On the light-emitting layer an electron-generating and transporting section 4-1-a, an intermediate layer 4-1-b, and a hole-generating and transporting section 4-1-c were successively formed. First, LiF was formed into a film of 1 nm thickness as the electron-generating and transporting section 4-1-a, and then Al was formed into a film of 1 nm thickness as a layer for generating a reducing reaction with the LiF layer. The following was then formed into a film of 3 nm thickness, as the non-semiconductor substance containing layer 4-1-b, thereon (deposition rate: 0.5 nm/sec): bis(2,2,6,6-tetramethyl-3,5-heptanedionato)calcium (hereinafter abbreviated to Ca(DPM)$_2$) represented by the following chemical formula:

[Formula 7]

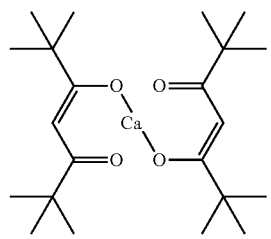

Next, HAT(CN)$_6$ was formed into a film of 10 nm thickness as the hole-generating and transporting section 4-1-c, and thereon Al was formed into a film of 150 nm thickness as a cathode thereon by vacuum deposition.

Reference Example 2

In Reference Example 2, a display element was produced in the same way as in Reference Example 1 except that, instead of the formation of the Ca(DPM)$_2$ layer, the following was formed into a film of 3 nm thickness as the intermediate layer 4-1-b in the connection layer: bis(dipivaloylmethanato) magnesium (Mg(acac)$_2$) represented by the following chemical formula:

[Formula 8]

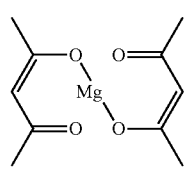

Reference Example 3

In Reference Example 3, a display element was produced in the same way as in Reference Example 1 except that, instead of the formation of the Ca(DPM)$_2$ layer, MgF$_2$ was formed into a film of 1.5 nm thickness as the intermediate layer 4-1-b in the connection layer.

Reference Example 4

In Reference Example 4, a display element was produced in the same way as in Reference Example 1 except that, instead of the formation of the Ca(DPM)$_2$ layer, AlF$_3$ was formed into a film of 3 nm thickness as the intermediate layer 4-1-b in the connection layer.

Evaluation:

After the film formation of each of the elements of Reference Examples 1 to 4, the substrate was shifted into an inert glove box. A UV curable resin was applied onto a glass cap, and the substrate and the cap were bonded each other. This substrate was taken out into the atmosphere, and a voltage was applied to the element to evaluate a current-voltage relationship. Shown are the comparison result of Reference Examples 1 and 2 in FIG. 2; the comparison result of Reference Examples 1 and 3 in FIG. 3; and the comparison result of Reference Examples 1 and 4 in FIG. 4. In each of these Reference Examples, four elements were produced similarly. The measurement results of the elements are shown in the same figure. For the elements of Reference Examples 1 to 4, the voltage and the luminance obtained when the current density was 10 mA/cm$^2$ are shown in Table 1.

TABLE 1

| | Intermediate layer | Current density (mA/cm$^2$) | Applied voltage (V) | Luminance (cd/m$^2$) |
|---|---|---|---|---|
| Reference Example 1 | Ca(DPM)$_2$ | 10 | 4.8 | 279 |
| Reference Example 2 | Mg(acac)$_2$ | 10 | 4.7 | 280 |
| Reference Example 3 | MgF$_2$ | 10 | 5.8 | 272 |
| Reference Example 4 | AlF$_3$ | 10 | 8.2 | 74 |

Figure 2:
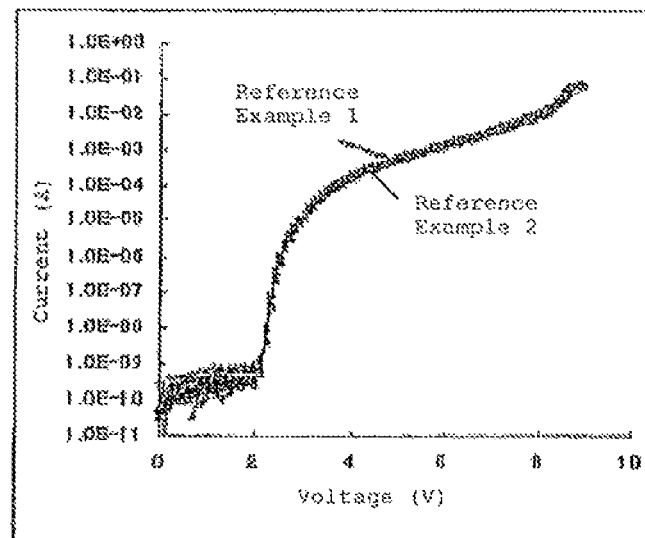
FIG. 2 is a graph showing the voltage-to-current densities of Reference Examples 1 and 2.
Figure 3:
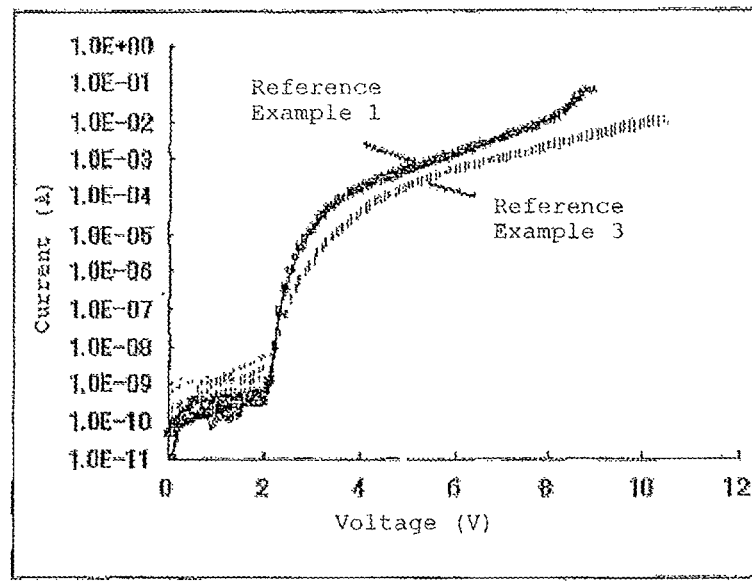
FIG. 3 is a graph showing the voltage-to-current densities of Reference Examples 1 and 3.
Figure 4:
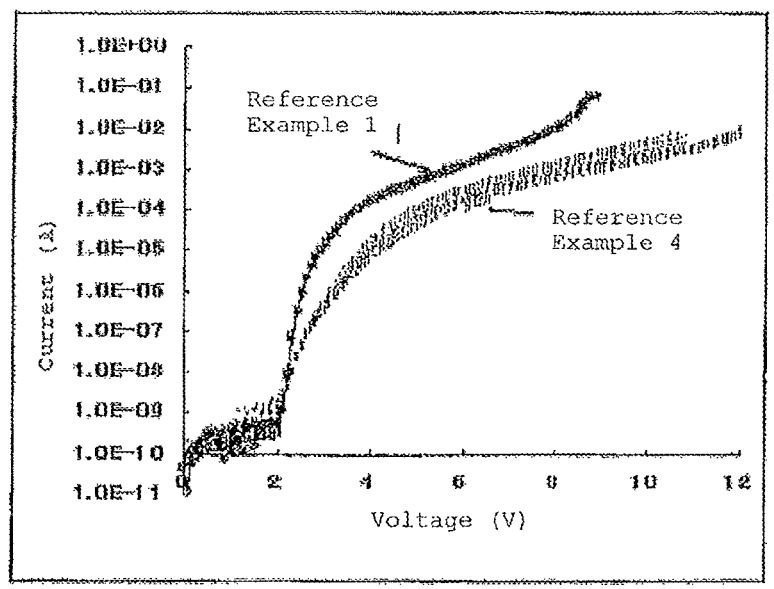
FIG. 4 is a graph showing the voltage-to-current densities of Reference Examples 1 and 4.

According to FIGS. 2 to 4, it was observed that in Reference Example 3 wherein MgF$_2$ having a resistivity of 10$^{14}$ Ω·cm or more and a dielectric constant of 5.0 was formed as the intermediate layer, the driving voltage was raised compared to Reference Example 1 wherein Ca(DPM)$_2$ layer was formed as the intermediate layer, and Reference Example 2 wherein Mg(acac)$_2$ layer was formed. It was also observed that in Reference Example 4 wherein AlF$_3$ having a resistivity of $10^{14}$ Ω·cm or more and a dielectric constant of 6.0 was formed as the intermediate layer, the driving voltage raised and further the luminance was lowered.

It is understood that in the case of using a substance having too large resistivity or dielectric constant for the intermediate layer 4-1-b of the connection layer as in Reference Examples 3 and 4, an extra voltage is applied to the connection layer so that charges tend to remain easily inside the connection layer. In the four elements produced in Reference Example 4, a large variation was generated in the current-voltage measurement. Thus, it is considered that a problem existed with the state of the connection between LiF in the electron-generating and transporting section and HAT(CN)$_6$ in the hole-generating and transporting section.

On the other hand, the elements of Reference Examples 1 and 2 were each smaller in driving voltage than those of Reference Examples 3 and 4. It is therefore considered that the connection between the electron-generating and transporting section and the hole-generating and transporting section was good, thereby forming a connection layer wherein the remaining charges was slight. When such a connection layer in which the remaining charges are slight is sandwiched between plural light-emitting units, the connection layer can satisfactorily act as a charge-generating layer for injecting electrons toward the anode and injecting holes toward the cathode.

In each of the Examples, Reference Examples and Comparative Examples described below, a bottom-type evaluation substrate was produced that had a light-emitting region 2 mm×2 mm in size formed on a glass substrate on which a patterned ITO film (thickness: 150 nm) was formed as an anode. In each of the Examples, a stacked type EL element as described with reference to FIG. 1 was produced. Stacked structures of a light-emitting unit 3-1 and a connection layer 4-1 in each of the Examples, Reference Examples and Comparative Examples are shown in Table 2.

TABLE 2

| | Light-emitting unit 3-1 | | | | Connection layer 4-1 | | | | | |
|---|---|---|---|---|---|---|---|---|---|---|
| | Hole-injecting | Hole-transporting | Light-emitting | Electron-transporting | 4-1-a | Reaction generating | 4-1-b | 4-1-c | | Cathode |
| Example 1 | HAT | NPD | Alq | | LiF | Al | CaDPM | HAT | LiF | Al |
| Example 2 | HAT | NPD | Alq | ETL-1 | Liq | Al | CaDPM | HAT | Liq | Al |
| Example 3 | HAT | NPD | Alq | ETL-1 | Liq | Al | CaDPM/HAT | HAT | Liq | Al |
| Example 4 | HAT | NPD | Alq | ETL-1 | Liq | Al | MgDPM | HAT | Liq | Al |
| Example 5 | Mo/NPD | NPD | Alq | | LiF | Al | CaDPM | Mo/NPD | LiF | Al |
| Example 6 | Mo/NPD | NPD | Alq | | Liq | Al | CaDPM | Mo/NPD | Liq | Al |
| Example 7 | Mo | NPD | Alq | | Liq | Al | CaDPM | Mo | Liq | Al |
| Example 8 | Mo | NPD | Alq | | Liq | Al | CaDPM/Mo | Mo | Liq | Al |
| Comparative Example 1 | HAT | NPD | Alq | | LiF | Al | — | HAT | LiF | Al |
| Comparative Example 2 | HAT | NPD | Alq | | Alq/Liq | Al | — | HAT | Alq/Liq | Al |
| Comparative Example 3 | HAT | NPD | Alq | ETL-1 | Liq | Al | — | HAT | Liq | Al |
| Reference Example 5 | HAT | NPD | Alq | | | | — | | LiF | Al |
| Reference Example 6 | HAT | NPD | Alq | ETL-1 | | | — | | Liq | Al |
| Comparative Example 4 | Mo/NPD | NPD | Alq | | LiF | Al | — | Mo/NPD | LiF | Al |
| Comparative Example 5 | Mo/NPD | NPD | Alq | | Liq | Al | — | Mo/NPD | Liq | Al |
| Comparative Example 6 | Mo | NPD | Alq | | Liq | Al | — | Mo | Liq | Al |
| Reference Example 7 | Mo/NPD | NPD | Alq | | | | — | | LiF | Al |
| Reference Example 8 | Mo/NPD | NPD | Alq | | | | — | | Liq | Al |
| Example 9 | Mo | NPD | Alq | | LiF | Al | Alq | Mo | LiF | Al |
| Example 10 | Mo | NPD | Alq | | LiF | Al | NPD | Mo | LiF | Al |
| Example 11 | HAT | NPD | Alq | ETL-1 | Liq | Al | NPD/HAT | HAT | Liq | Al |
| Example 12 | HAT | NPD | Alq | ETL-1 | Liq | Al | Alq/HAT | HAT | Liq | Al |
| Comparative Example 7 | Mo | NPD | Alq | | LiF | Al | — | Mo | LiF | Al |
| Comparative Example 8 | Mo | NPD | Alq | | Liq | Al | — | Mo | Liq | Al |
| Reference Example 9 | Mo | NPD | Alq | | | | — | | LiF | Al |
| Reference Example 10 | Mo | NPD | Alq | | | | — | | Liq | Al |

In Table 2, the structure of the light-emitting unit 3-2 is omitted. In the table, the symbol "/" denotes a vapor co-deposited film (vapor deposition ratio is omitted). In the table, the abbreviations are as follows:

HAT: HAT(CN)$_6$,

Mo: molybdenum trioxide (MoO$_3$),

NPD: α-NPD,

Alq: Alq$_3$,

CaDPM: Ca(DPM)$_2$, and

MgDPM: Mg(DPM)$_2$

Examples about the First Embodiment

Example 1

On the anode ITO a hole-injecting layer, a hole-transporting layer and a light-emitting layer as a first light-emitting unit were successively formed. First, HAT(CN)$_6$ was formed into a film of 10 nm thickness as the hole-injecting layer by vacuum deposition (deposition rate: 0.5 to 0.8 nm/sec).

Next, α-NPD was formed into a film of 50 nm thickness as the hole-transporting layer thereon by vacuum deposition (deposition rate: 0.8 to 1.2 nm/sec). Next, Alq$_3$ was formed into a film of 70 nm thickness, as the light-emitting layer functioning also as an electron-transporting layer, thereon by vacuum deposition (deposition rate: 2.9 to 3.1 nm/sec).

On the first light-emitting unit an electron-generating and transporting section 4-1-a, a non-semiconductor substance containing layer 4-1-b and a hole-generating and transporting section 4-1-c as a connection layer were successively formed. First, LiF was formed into a film of 1 nm thickness as the electron-generating and transporting section 4-1-a, and then Al was formed into a film of 1 nm thickness, as a layer for generating a reducing reaction with the LiF layer, thereon. Ca(DPM)$_2$ was then formed into a film of 3 nm thickness, as the non-semiconductor substance containing layer 4-1-b, thereon (deposition rate: 0.5 nm/sec).

Next, HAT(CN)$_6$ was formed into a film of 10 nm thickness as the hole-generating and transporting section 4-1-c thereon.

On the connection layer a second light-emitting unit 3-2 composed of an α-NPD layer of 50 nm thickness as a hole-transporting layer and an Alq$_3$ layer of 70 nm thickness as a light-emitting layer was formed. The hole-transporting layer and the light-emitting layer in the second light-emitting unit were formed under the same conditions as those for the individual layers in the first light-emitting unit. Furthermore, LiF and Al were successively formed into a film of 1 nm thickness and a film of 150 nm thickness, respectively, as a cathode 5 on the second light-emitting unit by vacuum deposition.

Example 2

In the same way as in Example 1, on the anode ITO an HAT(CN)$_6$ layer as a hole-injecting layer and an α-NPD layer as a hole-transporting layer were formed. Alq$_3$ was formed into a film of 50 nm thickness, as a light-emitting layer, thereon and then an electron-transporting material ETL-1 (aromatic compound-type electron-transporting material) was further formed into a film of 10 nm thickness thereon to form a first light-emitting unit.

An (8-quinolinolato)lithium complex (hereinafter abbreviated to Liq) represented by the following chemical formula was then formed into a film of 2.5 nm thickness as an electron-generating and transporting section 4-1-a thereon, and then Al was formed into a film of 1.5 nm thickness, as a layer for generating a reducing reaction with the Liq layer, thereon:

[Formula 9]

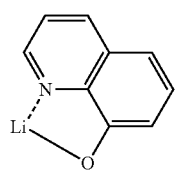

In the same way as in Example 1, a Ca(DPM)$_2$ layer as a non-semiconductor substance containing layer 4-1-b, and an HAT(CN)$_6$ layer as a hole-generating and transporting section 4-1-c were successively formed thereon to form a connection layer.

On the connection layer a second light-emitting unit composed of an α-NPD layer as a hole-transporting layer and an Alq$_3$ layer as a light-emitting layer was formed under the same conditions as those, for the individual layers in the first light-emitting unit. The second light-emitting unit was formed. Furthermore, LiF and Al were successively formed into a film of 1 nm thickness and a film of 150 nm thickness, respectively, as a cathode 5 on the second light-emitting unit by vacuum deposition. Furthermore, Liq and Al were successively formed into a film of 2.5 nm thickness and a film of 150 nm thickness, respectively, as a cathode 5 on the second light-emitting unit by vacuum deposition.

Examples 3-1 to 3-5

In Examples 3, display elements were each produced in the same way as in Example 2 except that a vapor co-deposited film of Ca(DPM)$_2$ and HAT(CN)$_6$ was formed into a thickness of 10 nm as the non-semiconductor substance containing layer 4-1-b in the connection layer. The content of Ca(DPM)$_2$ to the total of Ca(DPM)$_2$ and HAT(CN)$_6$ in the vapor co-deposited film was 80% by weight in Example 3-1; 67% by weight in Example 3-2; 50% by weight in Example 3-3; 33% by weight in Example 3-4; and 20% by weight in Example 3-5.

Example 4

In Example 4, a display element was produced in the same way as in Example 2 except that instead of the formation of the Ca(DPM)$_2$ layer, (2,2,6,6-tetramethyl-3,5-heptanedionato)magnesium (hereinafter abbreviated to Mg(DPM)$_2$) was formed into a film of 3 nm thickness as the non-semiconductor substance containing layer 4-1-b in the connection layer.

Comparative Example 1

In Comparative Example 1, a display element was produced in the same way as in Example 1 except that the non-semiconductor substance containing layer 4-1-b in the connection layer was not formed.

Comparative Example 2

In Comparative Example 2, a display element which did not have the non-semiconductor substance containing layer 4-1-b was produced in the same way as in Comparative Example 1 except that, instead of the formation of the LiF film of 1 nm thickness as each of the electron-generating and transporting section 4-1-a and the cathode, Alq$_3$ and Liq were formed into a film of 10 nm by vapor co-deposition with a ratio by film thickness of 1:3.

Comparative Example 3

In Comparative Example 3, a display element was produced in the same way as in Example 2 except that the non-semiconductor substance containing layer 4-1-b in the connection layer was not formed.

Reference Example 5

In Reference Example 5, in the steps of producing the display element of Example 1, an element having a one-unit structure, which was not a stacked structure, was produced by forming the cathode 5 directly onto the light-emitting unit 3-1.

Reference Example 6

In Reference Example 6, in the steps of producing the display element of Example 2, an element having a one-unit structure which was not a stacked structure was produced by forming the cathode 5 directly onto the light-emitting unit 3-1.

After the formation of each of the elements of the Examples and Comparative Examples, the substrate was shifted into an inert glove box. A UV curable resin was applied onto a glass cap, and the substrate and the cap were bonded onto each other. This substrate was taken out into the atmosphere, and a voltage was applied to the element to measure the luminance with a luminance meter, thereby evaluating the current-voltage-luminance property (I. V. L) thereof. For each of the elements, the voltage and the luminance obtained when the current density was 30 mA/cm$^2$ are shown in Table 3.

TABLE 3

| | Current density (mA/cm$^2$) | Applied voltage (V) | Light-emitting efficiency (cd/A) | Luminance (cd/m$^2$) |
|---|---|---|---|---|
| Example 1 | 30 | 11.9 | 5.6 | 1687 |
| Comparative Example 1 | 30 | 15.7 | 5.6 | 1669 |
| Reference Example 5 | 30 | 6.4 | 3.1 | 937 |
| Example 2 | 30 | 9.3 | 5.3 | 1643 |
| Example 3-1 | 30 | 10.5 | 6.0 | 1793 |
| Example 3-2 | 30 | 10.2 | 5.8 | 1736 |
| Example 3-3 | 30 | 9.8 | 5.7 | 1722 |
| Example 3-4 | 30 | 9.7 | 5.7 | 1741 |
| Example 3-5 | 30 | 9.8 | 5.5 | 1696 |
| Example 4 | 30 | 9.7 | 4.7 | 1397 |
| Comparative Example 2 | 30 | 12.3 | 4.8 | 1447 |
| Comparative Example 3 | 30 | 10.3 | 4.6 | 1388 |
| Reference Example 6 | 30 | 5.3 | 3.1 | 948 |

Figure 5:
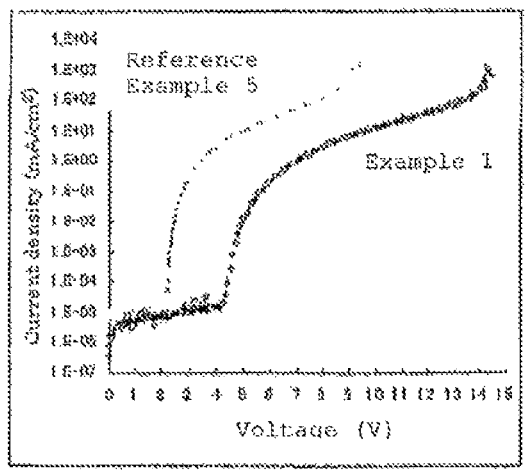
FIGS. 5A to 5C are each a graph showing a characteristic of each element of Example 1 and Reference Example 5.
Figure 5:
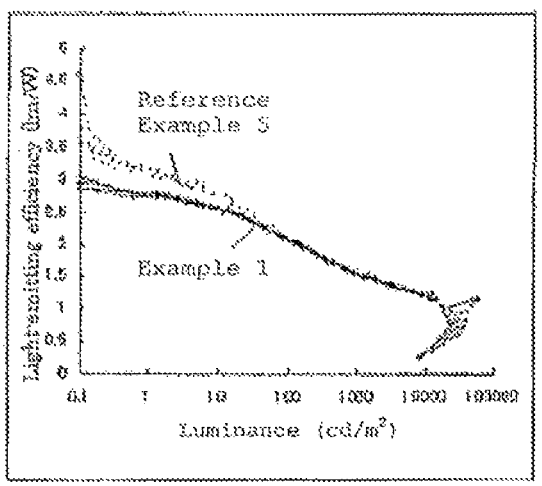
Figure 5:
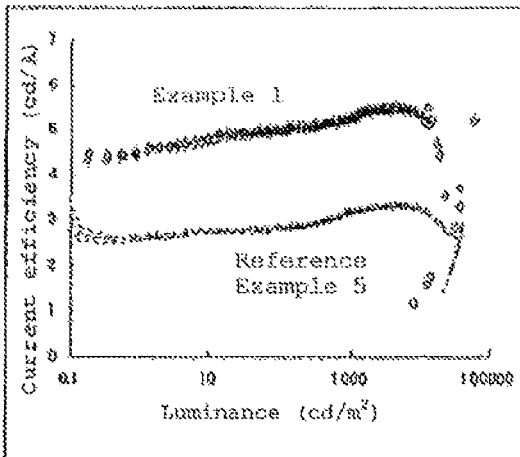
Figure 6:
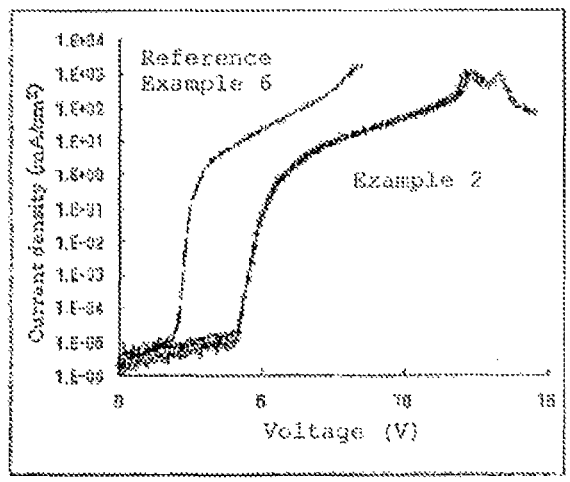
FIGS. 6A to 6C are each showing a characteristic of each element of Example 2 and Reference Example 6.
Figure 6:
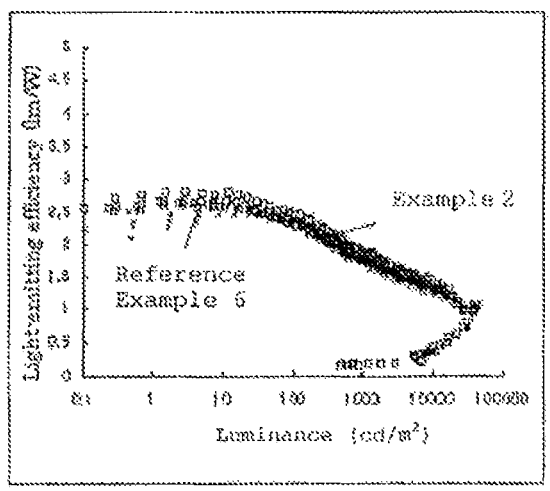
Figure 6:
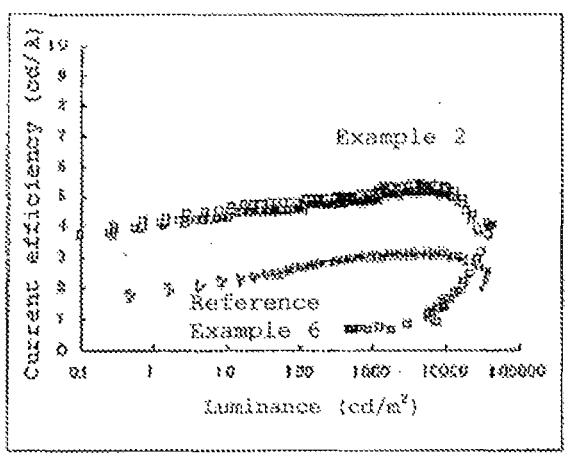
Figure 7:
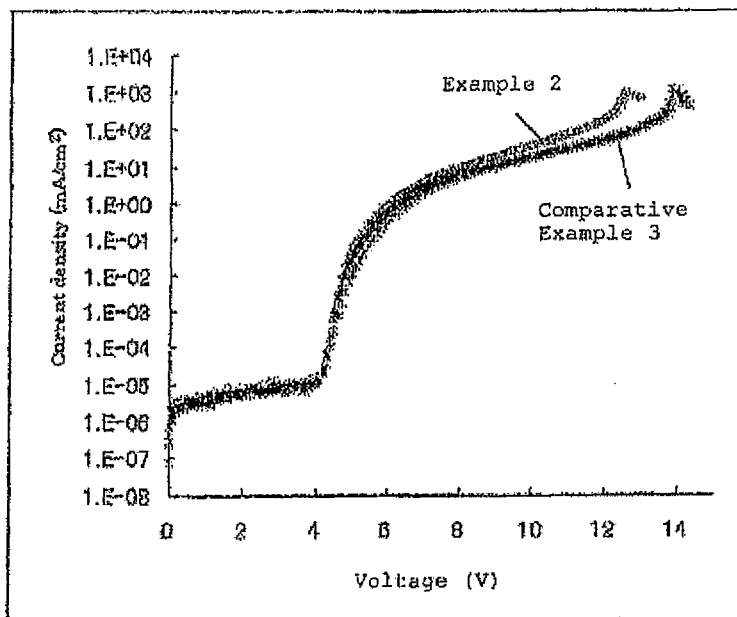
FIG. 7 is a graph showing the voltage-to-current densities of Example 2 and Comparative Example 3.
Figure 10:
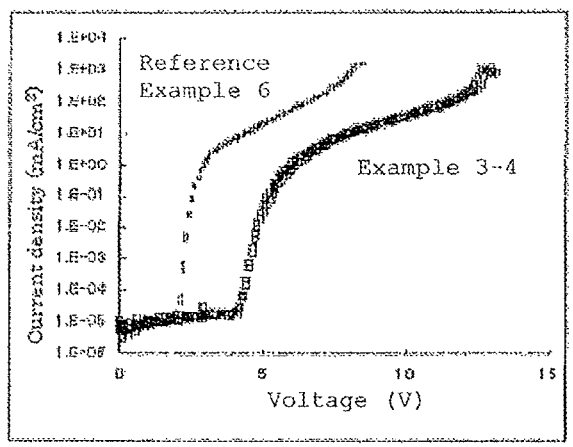
FIGS. 10A to 10C are each a graph showing a characteristic of each element of Example 3-4 and Reference Example 6.
Figure 10:
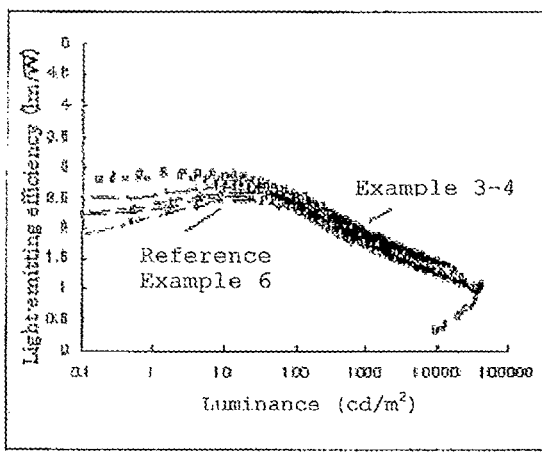
Figure 10:
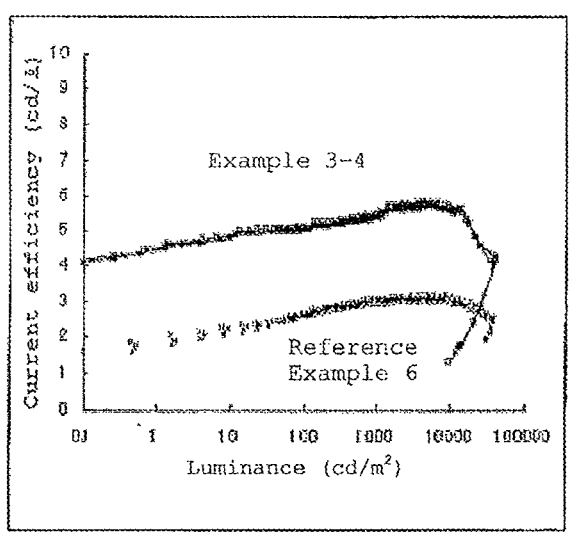
Figure 11A:
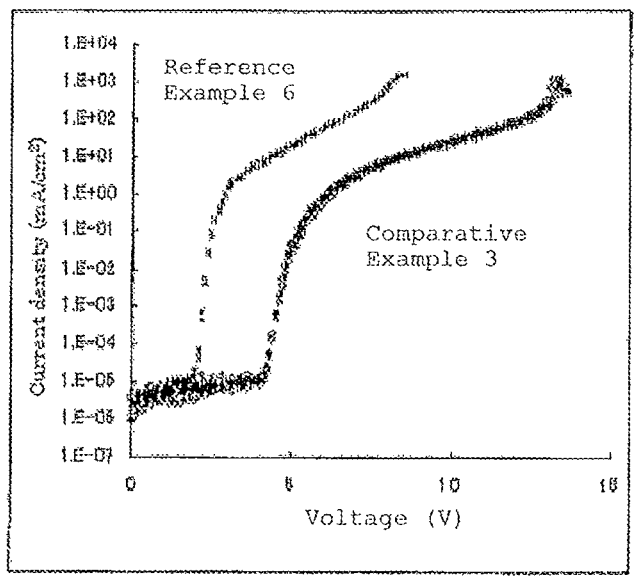
FIGS. 11A to 11B are each a graph showing a characteristic of each element of Comparative Example 3 and Reference Example 6.
Figure 11B:
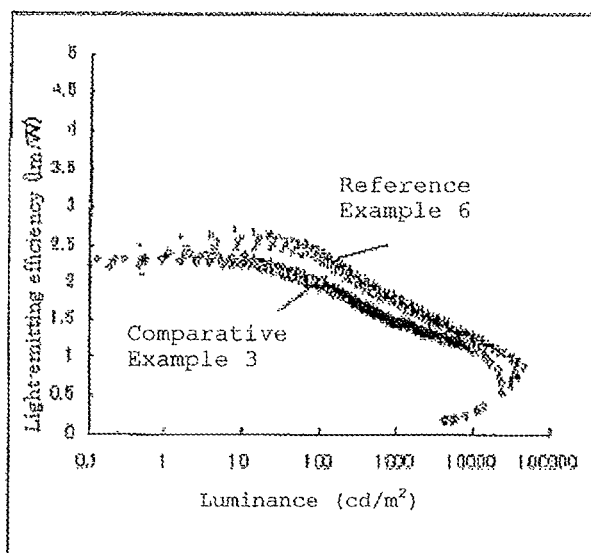
Figure 12:
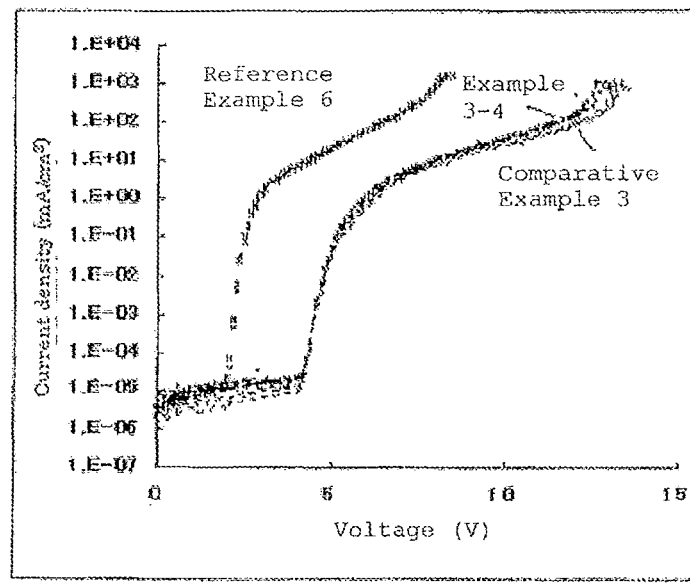
FIG. 12 is a graph showing the voltage-to-current densities of Example 3-4, Comparative Example 3, and Reference Example 6.
Figure 13:
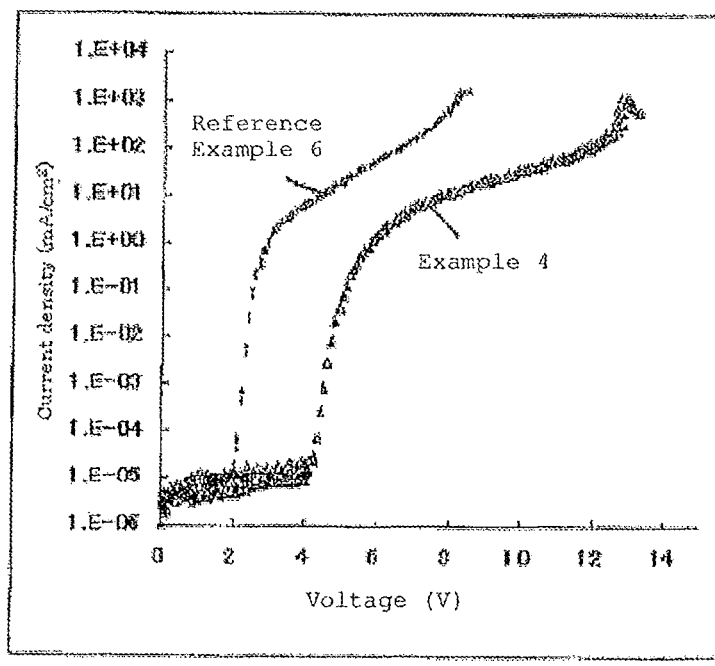
FIG. 13 is a graph showing the voltage-to-current densities of Example 4 and Reference Example 6.

The comparison result of Example 1 and Reference Example 5 is shown in FIGS. 5A to 5C; the comparison result of Example 2 and Reference Example 6 is shown in FIGS. 6A to 6C; the comparison result of Example 2 and Comparative Example 3 is shown in FIG. 7; the comparison result of Example 3-4 and Reference Example 6 is shown in FIGS. 10A to 10C; the comparison result of Comparative Example 3 and Reference Example 6 is shown in FIGS. 11A to 11B; and the comparison result of Example 4 and Reference Example 6 is shown in FIG. 13. Moreover, the comparison result of Example 3-4, Reference Example 6 and Comparative Example 3 is shown in FIG. 12. FIGS. 5A to 5C, 6A to 6C and 10A to 10C show the voltage-to-current density, the light-emitting efficiency, and the current efficiency, respectively. FIGS. 11A to 11B show the voltage-to-current density, and the light-emitting efficiency, respectively. FIG. 12 shows the comparison result of the voltage-to-current densities of Example 3-4, Comparative Example 3, and Reference Example 6.

When the element of Example 1 is compared with the element of Reference Example 5 which had only one light-emitting unit, it is understood that: Example 1 exhibited a voltage about two times that of Reference Example 5 when the two had the same current density as illustrated in FIG. 5A; and that as illustrated in FIG. 5B, in Example 1, the light-emitting efficiency of Reference Example 5 was sustained. In other words, it is understood that in Example 1, the luminance was about two times higher than that in Reference Example 5 without damaging the electric power light-emitting efficiency of Reference Example 5 and thus the connection layer between the light-emitting units functioned ideally. It is also understood from FIGS. 6A to 6C, 10A to 10C and 13 that the same results are observed when the elements of Examples 2, 3-4 and, 4, and Reference Example 6 are compared with each other.

In contrast, according to FIGS. 11A to 11C and 12, when Reference Example 6 is compared with Comparative Example 3, Comparative Example 3 showed a voltage exceeding twice that of Reference Example 6 in the region of high current densities. It is understood from this matter that in Comparative Example 3, which did not have the intermediate layer 4-1-b, the electric power light-emitting efficiency was damaged.

Figure 8:
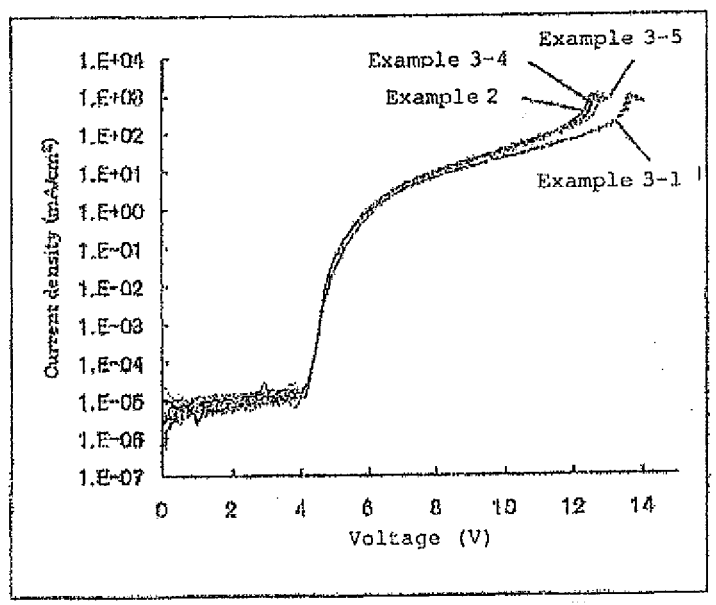
FIG. 8 is a graph showing the voltage-to-current densities of Examples 2, 3-1, 3-4 and 3-5.
Figure 9:
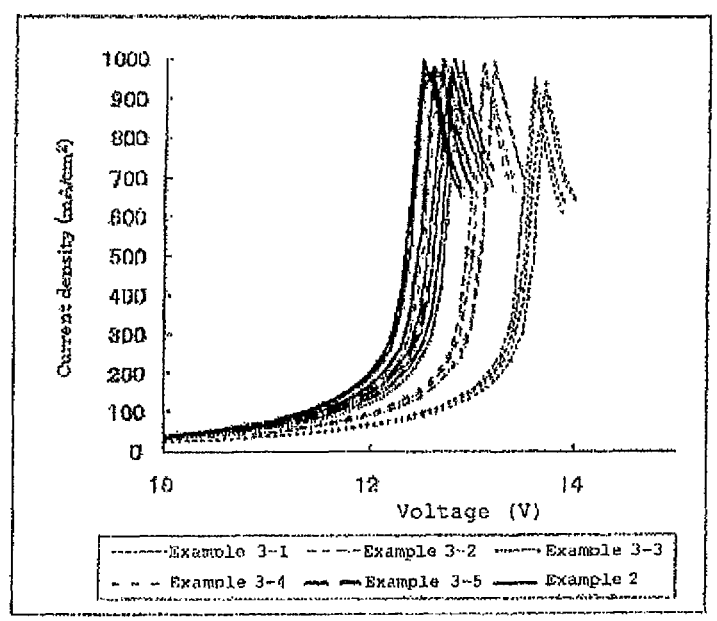
FIG. 9 is a graph showing the voltage-to-current densities of Examples 2, and 3-1 to 3-5 in the range of high voltages.

FIG. 8 shows the comparison result of the voltage-to-current densities of Examples 2, 3-1, 3-4, and 3-5. FIG. 9 shows the comparison result of the voltage-to-current densities of Examples 2 and 3-1 to 3-5 in the region of high voltages (10 V or more). In Example 3-4, the amount of Ca(DPM)$_2$, which is a non-semiconductor substance, in the intermediate layer 4-1-b was 33% by weight, and the value obtained by multiplying the film thickness (10 nm) of the intermediate layer by the content of the non-semiconductor substance was 3 nm. The element of Example 3-4 had an intermediate layer with a thickness of 3 nm, and had the same voltage-current property as the element of Example 2, which had the single layer of Ca(DPM)$_2$ (content 100% by weight). It is understood from this matter that even when the intermediate layer is a mixed layer, by adjusting the value obtained by multiplying the thickness of the intermediate layer by the content of the non-semiconductor substance, it is possible to obtain an element wherein its connection layer functions as a charge-generating layer in the same manner as in an element of which the intermediate layer is a single layer, and the same property is exhibited. Moreover, in Example 3-3, wherein the content of Ca(DPM)$_2$ in the intermediate layer was 50% by weight, and in Example 3-5, wherein the content of Ca(DPM)$_2$ was 25% by weight, the obtained elements had the same voltage-current property as in Example 3-4.

On the other hand, as shown in Table 3, Example 3-1, wherein the content of Ca(DPM)$_2$ was 80% by weight, and Example 3-2, wherein the content of Ca(DPM)$_2$ was 67% by weight, were higher in voltage than Example 2 and Example 3-4, and gave a driving voltage equivalent to that of Comparative Example 3, which did not have the intermediate layer 4-1-b. In contrast, as shown in Table 3, the elements of Examples 3-1 and 3-2 were higher in light-emitting efficiency than the element of Comparative Example 3. It is therefore stated that the elements of Examples 3-1 and 3-2 can be made lower in driving voltage than the element of Comparative Example 3 when these elements are made to emit light with the same luminance.

Figure 14:
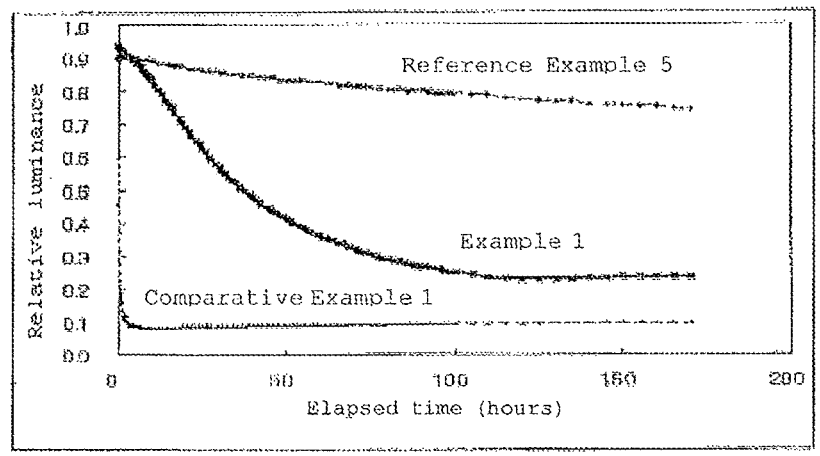
FIG. 14 is a graph showing lifetime test results of Example 1, Comparative Example 1, and Reference Example 5.
Figure 15:
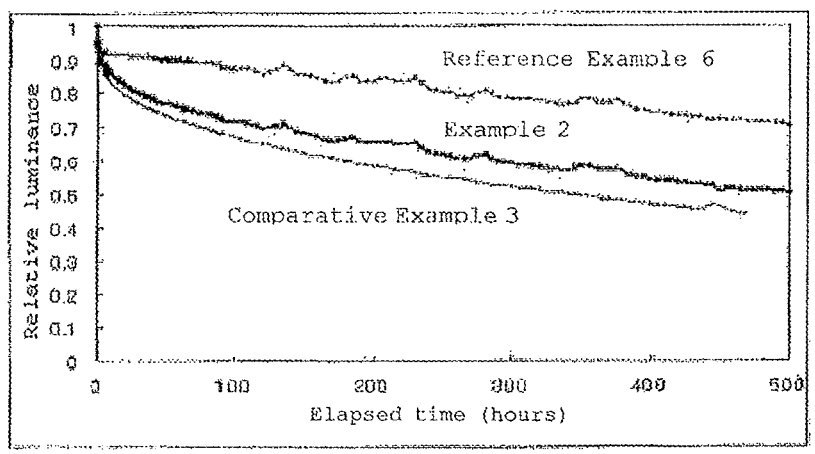
FIG. 15 is a graph showing lifetime test results of Example 2, Comparative Example 3, and Reference Example 6.

Lifetime test results of Example 1, Comparative Example 1 and Reference Example 5 are shown in FIG. 14, and lifetime test results of Example 2, Comparative Example 3 and Reference Example 6 are shown in FIG. 15. Each of the lifetime test results in FIGS. 14 and 15 shows a change with time in the relative luminance that was obtained by a normalization to the luminance of each of the elements at the initial time (time: 0), which was regarded as 1 under a condition that the current density was a constant value of 70 mA/cm$^2$. It is understood from the results that in Comparative Examples 1 and 3, which had no connection layer, the initial-luminance deterioration thereof was remarkable and the deterioration with time was also large.

In contrast, it is understood that for each of the elements of Examples 1 and 2, the lifetime was improved in comparison with the elements of Comparative Examples 1 and 2. The elements of Examples 1 and 2 deteriorated more speedily than those of Reference Examples 5 and 6; however, this was because in Examples 1 and 2, the elements were made to emit light at about two times the electric power of in Reference Examples 5 and 6, i.e., with about two times the luminance of that therein, since the lifetime test was carried out with a constant current density.

Example 5

In Example 5, a display element was produced in the same way as in Example 1 except that, instead of the forming $HAT(CN)_6$ layers for each of the hole-injecting layer in the first light-emitting unit and the hole-generating and transporting section 4-1-c in the connection layer, molybdenum trioxide ($MoO_3$) and α-NPD were formed into a film of 10 nm by vapor co-deposition with a ratio by film thickness of 1:9.

Example 6

In Example 6, a display element was produced in the same way as in Example 5 except that instead of forming a LiF film of 1 nm thickness for each of the electron-generating and transporting section 4-1-a and the cathode, a Liq film of 1 nm thickness was formed.

Example 7

In Example 7, a display element was produced in the same way as in Example 6 except that, instead of forming a vapor co-deposited film of $MoO_3$ and α-NPD for each of the hole-injecting layer in the first light-emitting unit and the hole-generating and transporting section 4-1-c in the connection layer, a single layer of $MoO_3$ of 10 nm film thickness was formed (deposition rate: 0.3 to 0.5 nm/sec).

Example 8

In Example 8, a display element was produced in the same way as in Example 7 except that $Ca(DPM)_2$ and $MoO_3$ were formed into a film of 2 nm, as the non-semiconductor substance containing layer 4-1-b in the connection layer, by vapor co-deposition with a ratio of film thickness of 1:1.

Comparative Example 4

In Comparative Example 4, a display element was produced in the same way as in Example 5 except that the non-semiconductor substance containing layer 4-1-b in the connection layer was not formed.

Comparative Example 5

In Comparative Example 5, a display element was produced in the same way as in Example 6 except that the non-semiconductor substance containing layer 4-1-b in the connection layer was not formed.

Comparative Example 6

In Comparative Example 6, a display element was produced in the same way as in Example 7 except that the non-semiconductor substance containing layer 4-1-b in the connection layer was not formed.

Reference Example 7

In Reference Example 7, in the steps of producing the display element of Example 5, an element having a one-unit structure which was not a stacked structure was produced by forming the cathode 5 directly onto the light-emitting unit 3-1.

Reference Example 8

In Reference Example 8, in the steps of producing the display element of Example 6, an element having a one-unit structure which was not a stacked structure was produced by forming the cathode 5 directly onto the light-emitting unit 3-1.

Figure 16:
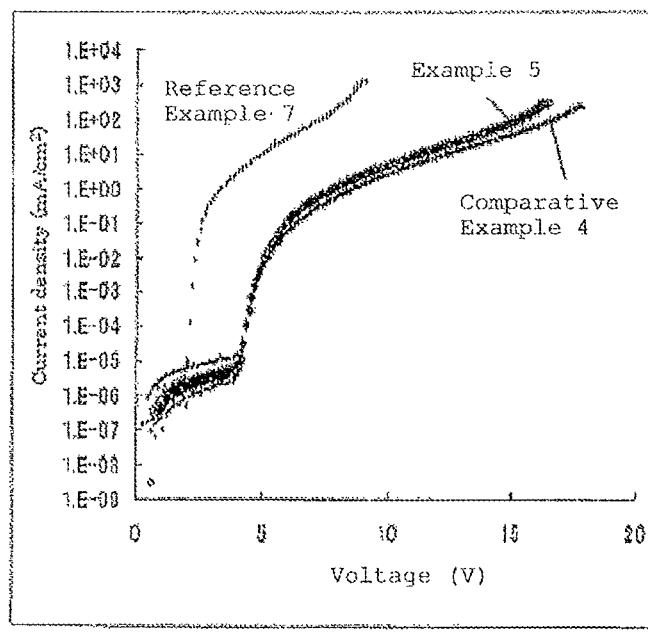
FIGS. 16A to 16B are each a graph showing a characteristic of each element of Example 5, Comparative Example 4 and Reference Example 7.
Figure 16:
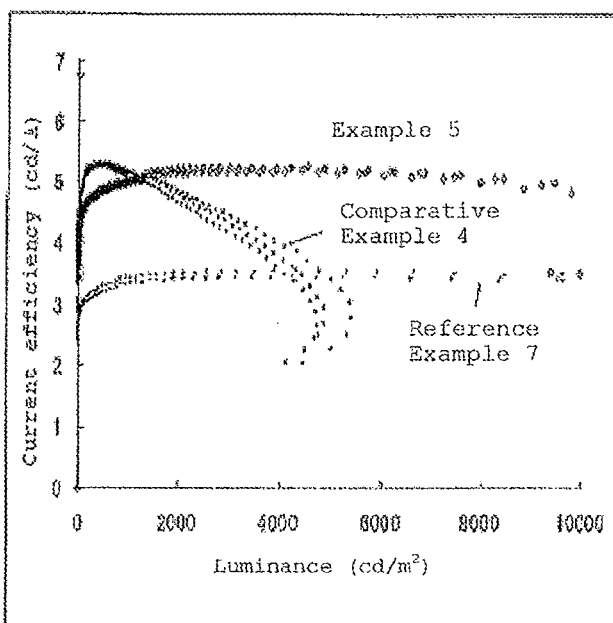
Figure 17A:
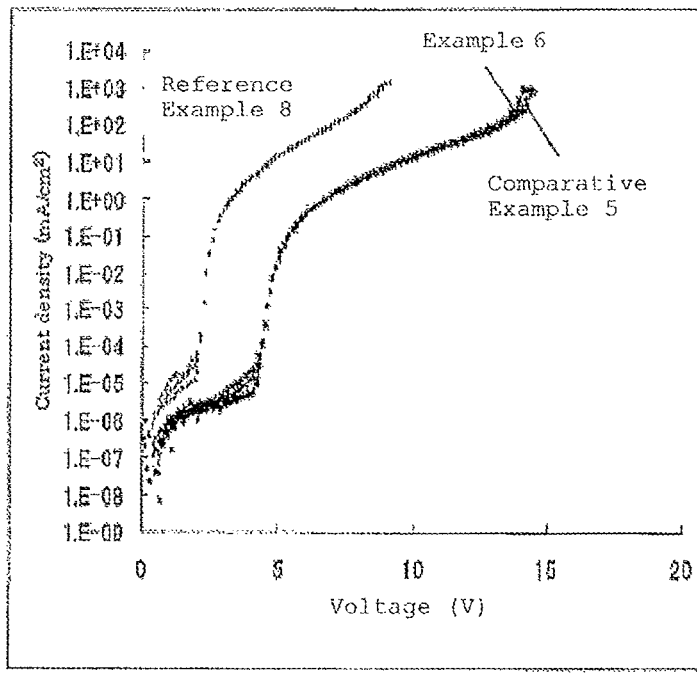
Figure 17B:
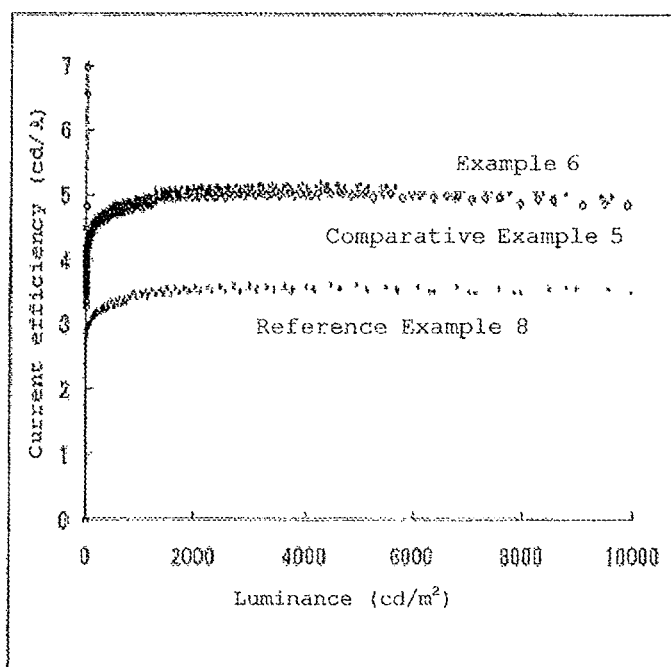
FIGS. 17B to 17B are each a graph showing a characteristic of each element of Example 6, Comparative Example 5 and Reference Example 8.

After the formation of each of the elements of the Examples and Comparative Examples, the substrate was shifted into an inert glove box under inert conditions. A UV curable resin was applied onto a glass cap, and the substrate and the cap were bonded onto each other. This substrate was taken out into the atmosphere, and a voltage was applied to the element to evaluate the current-voltage relationship. The results are shown in Table 4. The comparison result of Example 5, Comparative Example 4 and Reference Example 7 is shown in FIGS. 16A to 16B; and the comparison result of Example 6, Comparative Example 5 and Reference Example 8 is shown in FIGS. 17A to 17B. FIGS. 16A to 16B and 17A to 17B, show the voltage-to-current density, and the light-emitting efficiency, respectively. light-emitting efficiency, respectively.

TABLE 4

| | Current density (mA/cm$^2$) | Applied voltage (V) | Light-emitting efficiency (cd/A) | Luminance (cd/m$^2$) |
| --- | --- | --- | --- | --- |
| Example 5 | 30 | 13.4 | 5.1 | 1547 |
| Comparative Example 4 | 30 | 14.7 | 5.0 | 1543 |
| Reference Example 7 | 30 | 6.1 | 3.4 | 1045 |
| Example 6 | 30 | 11.4 | 5.0 | 1574 |
| Comparative Example 5 | 30 | 11.5 | 5.0 | 1488 |
| Reference Example 8 | 30 | 5.9 | 3.4 | 1114 |

When the element of Example 5 is compared with the element of Reference Example 7, which had only one light-emitting unit, it is understood that: Example 5 exhibited about two times the voltage of that of Reference Example 7 when the two had the same current density as shown in FIG. 16A and Table 4; and that from FIG. 16B, the element of Example 5 had a high current efficiency. By contrast, Comparative Example 4 exhibited a voltage exceeding two times the voltage of that of Reference Example 7 when these had the same current density; thus, it is understood that the current efficiency lowered remarkably in the region of high luminances. In other words, it is understood that in Example 5, the luminance was about two times higher than that in Reference Example 7 without damaging the electric power light-emitting efficiency of Reference Example 7 and thus the connection layer between the light-emitting units functioned ideally.

When Example 6, Comparative Example 5, and Reference Example 8 are compared with each other, the same tendency is recognized. However, it is understood that the comparison between Example 5 wherein LiF was used for the electron-generating and transporting section 4-1-*a*, and Comparative Example 4 demonstrates a more remarkable difference based on whether or not these elements each had the layer containing the electrically insulating non-semiconductor substance. From this matter, it is understood that in a structure wherein LiF is used for an electron-generating and transporting section of a lining layer, the presence of the non-semiconductor substance containing layer 4-1-*b* is particularly important.

Examples about the Second Embodiment

Example 9

On the anode ITO a hole-injecting layer, a hole-transporting layer and a light-emitting layer as a first light-emitting unit were successively formed. First, $MoO_3$ was formed into a film of 10 nm thickness as the hole-injecting layer by vacuum deposition (deposition rate: 0.3 to 0.5 nm/sec). Next, α-NPD was formed into a film of 50 nm thickness as the hole-transporting layer thereon by vacuum deposition (deposition rate: 0.8 to 1.2 nm/sec). Next, $Alq_3$ was formed into a film of 60 nm thickness, as the light-emitting layer functioning also as an electron-transporting layer, thereon by vacuum deposition (deposition rate: 2.9 to 3.1 nm/sec).

On the first light-emitting layer 3-1 an electron-generating and transporting section 4-1-*a*, an electron-transporting organic material containing layer 4-1-*b*, and a hole-generating and transporting section 4-1-*c* as a connection layer were successively formed.

First, LiF was formed into a film of 1 nm thickness as the electron-generating and transporting section 4-1-*a*, and then Al was formed into a film of 1 nm thickness, as a layer for generating a reducing reaction with the LiF layer, thereon. $Alq_3$, which is an electron-transporting organic material, was then formed into a film of 2 nm thickness, as the electron-transporting organic material containing layer 4-1-*b*, thereon (deposition rate: 0.5 nm/sec).

Next, $MoO_3$ was formed into a film of 10 nm thickness as the hole-generating and transporting section 4-1-*c* thereon.

On the connection layer a second light-emitting unit composed of a $MiO_3$ layer of 10 nm thickness as a hole-transporting layer and an $Alq_3$ layer of 60 nm thickness as a light-emitting layer was formed. The hole-transporting layer and the light-emitting layer in the second light-emitting unit were formed under the same conditions as used to form the individual layers in the first light-emitting unit. Furthermore, LiF and Al were formed into a film of 1 nm thickness and a film of 150 nm thickness, respectively, as a cathode 5 on the second light-emitting unit by vacuum deposition.

Example 10

In Example 10, a display element was produced in the same way as in Example 9 except that, instead of the formation of $Alq_3$, the film of the electron-transporting organic material as the charge-transporting organic material containing layer 4-1-*b* in the connection layer, α-NPD, which is a hole-transporting organic material, was formed into a film of 2 nm thickness (deposition rate: 0.5 nm/sec).

Comparative Example 7

In Comparative Example 7, a display element was produced in the same way as in Example 9 except that the charge-transporting organic material containing layer 4-1-*b* in the connection layer was not formed.

Comparative Example 8

In Comparative Example 8, a display element was produced in the same way as in Example 9 except that instead of the formation of the LiF film of 1 nm thickness for each of the electron-generating and transporting section 4-1-*a* and the cathode, Liq was formed into a film of 1 nm thickness, and the intermediate layer 4-1-*b* was not formed.

Reference Example 9

In Reference Example 9, in the steps of producing the display element of Example 9, an element having a one-unit structure which was not a stacked structure was produced by forming the cathode 5 directly onto the light-emitting unit 3-1.

Reference Example 10

Reference Example 10, in the steps of producing the display element of Comparative Example 8, an element having a one-unit structure which was not a stacked structure was produced by forming the cathode 5 directly onto the light-emitting unit 3-1.

After the formation of each of the organic EL elements of Examples 9 and 10, Comparative Examples 7 and 8, and Reference Examples 9 and 10 each produced as described above, the substrate was shifted into an inert glove box. A UV curable resin was applied onto a glass cap, and the substrate and the cap were bonded onto each other. This substrate was taken out into the atmosphere, and a voltage was applied to the element to measure the luminance with a luminance meter, thereby evaluating a voltage-current-luminance property (I. V. L). In Table 5 the voltage and the luminance of each of the elements that were generated when the current density was 30 $mA/cm^2$ are shown.

TABLE 5

| | Current density ($mA/cm^2$) | Applied voltage (V) | Light-emitting efficiency (cd/A) | Luminance ($cd/m^2$) |
|---|---|---|---|---|
| Example 9 | 30 | 13.1 | 5.1 | 1608 |
| Example 10 | 30 | 12.3 | 4.7 | 1435 |
| Comparative Example 7 | 30 | 15.3 | 3.4 | 1041 |
| Reference Example 9 | 30 | 6.1 | 3.3 | 986 |
| Comparative Example 8 | 30 | 12.1 | 4.9 | 1518 |
| Reference Example 10 | 30 | 6.1 | 3.3 | 986 |

As also understood from Table 5, the elements of Examples 9 and 10 were lower in driving voltage than the organic EL element of Comparative Example 7 when these elements had the same current density. Thus, it is understood that in the elements of Examples 9 and 10, an extra voltage generated when plural light-emitting units were laminated was decreased.

Figure 18:
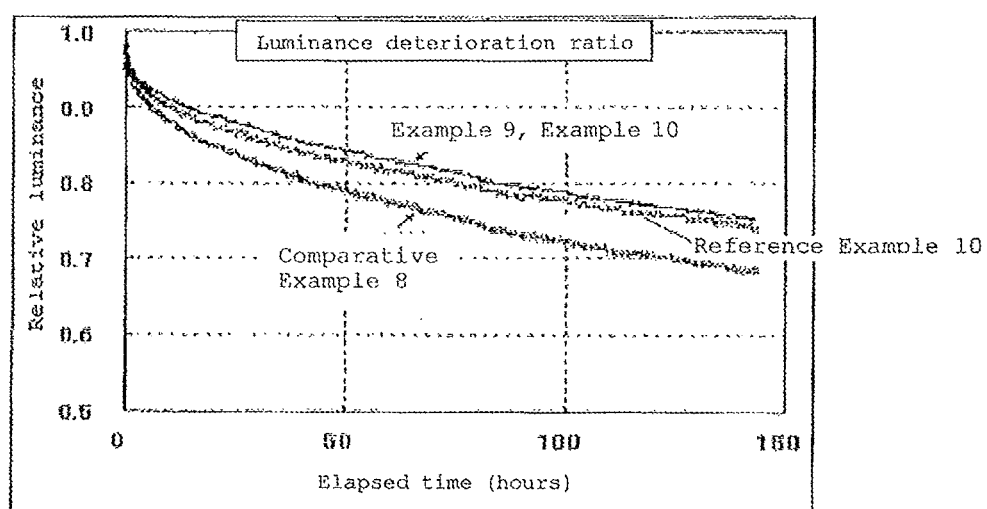
FIG. 18 is a graph showing lifetime test results of Examples 9 and 10, Comparative Example 8 and Reference Example 10.

In FIG. 18, lifetime test results of the elements of Examples 9 and 10, Comparative Example 8 and Reference Example 10 are shown. The lifetime test results in FIG. 18 each show a change with time in the relative luminance that was obtained by a normalization to the luminance of the element at the initial time (time: 0), which was regarded as 1 under a condition that the current density was a constant value of 70 mA/cm$^2$. It is understood from the results that the elements of Examples 9 and 10 were better improved in element lifetime than the element of Comparative Example 8 so as to be comparable to the element of Reference Example 10 which had only one light-emitting unit.

Example 11

In Example 11, a display element was produced in the same way as in Example 2 except that a vapor co-deposited film of α-NPD and HAT(CN)$_6$ (ratio by weight of 1:1) was formed into a film thickness of 10 nm (deposition rate: 0.5 to 0.8 nm/sec) as the intermediate layer 4-1-b in the connection layer.

Example 12

In Example 12, a display element was produced in the same way as in Example 2 except that a vapor co-deposited film of Alq$_3$ and HAT(CN)$_6$ (ratio by weight of 1:2) was formed into a film thickness of 10 nm as the intermediate layer 4-1-b in the connection layer.

After the formation of each of the organic EL elements of Examples 11 and 12 each produced as described above, the substrate was shifted into an inert glove box. A UV curable resin was applied onto a glass cap, and the substrate and the cap were bonded onto each other. This substrate was taken out into the atmosphere, and a voltage was applied to the element to measure the luminance with a luminance meter, thereby evaluating the voltage-current-luminance property (I. V. L). For each of the elements of Examples 11 and 12, the voltage and the luminance generated when the current density was 30 mA/cm$^2$, together with the results of Comparative Examples 1 and 3 are shown in Table 6.

TABLE 6

| | Current density (mA/cm$^2$) | Applied voltage (V) | Light-emitting efficiency (cd/A) | Luminance (cd/m$^2$) |
|---|---|---|---|---|
| Example 11 | 30 | 10.2 | 5.6 | 1778 |
| Comparative Example 1 | 30 | 15.7 | 5.6 | 1669 |
| Example 12 | 30 | 10.0 | 5.4 | 1644 |
| Comparative Example 3 | 30 | 10.3 | 4.6 | 1388 |

As also understood from Table 6, the elements of Examples 11 and 12 where the charge-transporting organic material containing layer was formed as the intermediate layer 4-1-b, were lower in driving voltage than Comparative Examples 1 and 3 which each had no connection layer, when these elements had the same current density. Thus, it is understood that, in the elements of Examples 11 and 12, an extra voltage generated when the plural light-emitting units were laminated was decreased.

As shown above through the comparisons of Examples, Comparative Examples and Reference Examples of the first embodiment of the invention, which has a layer containing an electrically-insulating non-semiconductor substance as the intermediate layer 4-1-b of the connection layer, and the second embodiment of the invention, which has a layer containing a charge-transporting organic material as its intermediate layer 4-1-b, the connection layer acts satisfactorily as a charge-generating layer. Thus, it is understood that the voltage-rise in the case of laminating the plural light-emitting units is restrained so that the lifetime of the element can be extended.

DESCRIPTION OF REFERENCE CHARACTERS

1 substrate
2 anode
3-1 and 3-2 light-emitting units
4-1 connection layer
4-1-a electron-generating and transporting section
4-1-b intermediate layer
4-1-c hole-generating and transporting section
5 cathode

The invention claimed is:

1. An organic electroluminescent element, comprising
an anode,
a cathode,
plural light-emitting units that are stacked between the anode and the cathode, each light-emitting unit comprising at least one organic light-emitting layer, and
a connection layer sandwiched between the respective light-emitting units,
wherein in the connection layer, the following are successively stacked from an anode side:
an electron-generating and transporting section comprising at least one selected from the group consisting of alkali metals, alkaline earth metals, rare earth metals, and alloys of these metals, and compounds of these metals, provided that any metal oxide is excluded;
a layer comprising a non-semiconductor substance having a resistivity of 1.0×10$^2$ 1.0×10$^9$Ω·cm and having a dielectric constant of 2 to 4.5 inclusive; and
a hole-generating and transporting section comprising molybdenum oxide.

2. The organic electroluminescent element according to claim 1, wherein the hole-generating and transporting section is a mixed layer of molybdenum oxide and a hole-transporting material.

3. The organic electroluminescent element according to claim 2, wherein the hole-transporting material is an arylamine compound.

4. A display device, comprising an organic electroluminescent element according to claim 1.

5. A lighting apparatus, comprising an organic electroluminescent element according to claim 1.

6. The organic electroluminescent element according to claim 1, wherein the intermediate layer comprises a non-semiconductor substance having a resistivity of 1.0×10$^2$ to 1.0×10$^9$ Ω·cm and having a dielectric constant of 2 to 4.5 inclusive.

7. The organic electroluminescent element according to claim 1, wherein the non-semiconductor substance is bis(2,2,6,6-tetramethyl-3,5-heptanedionato)calcium, bis(2,4-pentanedionato)magnesium, bis(2,2,6,6-tetramethyl-3,5-heptanedionato)magnesium, 2,2,6,6-tetramethyl-3,5-heptanedionatolithium, or tris(2,2,6,6-tetramethyl-3,5-heptanedionato)aluminum.

* * * * *